(12) United States Patent
Saito et al.

(10) Patent No.: US 12,215,931 B2
(45) Date of Patent: Feb. 4, 2025

(54) HEAT EXCHANGER

(71) Applicant: DENSO CORPORATION, Kariya (JP)

(72) Inventors: Yuya Saito, Kariya (JP); Ryohei Tomita, Kariya (JP)

(73) Assignee: DENSO CORPORATION, Kariya (JP)

( * ) Notice: Subject to any disclaimer, the term of this patent is extended or adjusted under 35 U.S.C. 154(b) by 246 days.

(21) Appl. No.: 17/886,713

(22) Filed: Aug. 12, 2022

(65) Prior Publication Data
US 2022/0390183 A1     Dec. 8, 2022

Related U.S. Application Data

(63) Continuation of application No. PCT/JP2021/000516, filed on Jan. 8, 2021.

(30) Foreign Application Priority Data

Feb. 18, 2020   (JP) .................................. 2020-025292

(51) Int. Cl.
  *F28D 9/00*     (2006.01)
(52) U.S. Cl.
  CPC .................. *F28D 9/0075* (2013.01)
(58) Field of Classification Search
  CPC ........ F28D 9/00; F28D 9/0075; F28D 1/0333; F28D 1/0325; F28D 1/05325; F28D 1/05366; F28D 9/005; F28F 3/027; F28F 1/40; F28F 3/086; F28F 3/04; H01L 23/473

See application file for complete search history.

(56) References Cited

U.S. PATENT DOCUMENTS

| | | |
|---|---|---|
| 2001/0033477 A1 | 10/2001 | Inoue et al. |
| 2003/0090873 A1 | 5/2003 | Ohkouchi |
| 2004/0144996 A1 | 7/2004 | Inoue |
| 2005/0040515 A1 | 2/2005 | Inoue et al. |
| 2006/0120047 A1 | 6/2006 | Inoue |
| 2006/0232939 A1 | 10/2006 | Inoue |

(Continued)

FOREIGN PATENT DOCUMENTS

| | | | |
|---|---|---|---|
| JP | H0198896 A | * | 4/1988 |
| JP | H10-173375 A | | 6/1998 |
| JP | 4774581 B2 | | 9/2011 |

(Continued)

*Primary Examiner* — Harry E Arant

(74) *Attorney, Agent, or Firm* — Harness, Dickey & Pierce, P.L.C.

(57) ABSTRACT

A flow path tube of a heat exchanger includes an inner fin having a meander shape in which a one-side top part and an other-side top part are alternately arranged via an intermediate part. The intermediate part includes a communication part with a communication port that communicates the adjacent fine flow paths. A one-side wall part is extended from the one-side top part, which is adjacent on one side, to the communication part and separates the adjacent fine flow paths. An other-side wall part is extended from the other-side top part, which is adjacent on the other side, to the communication part and separates the adjacent fine flow paths. An edge of the one-side wall part is formed such that an edge of the other-side wall part is shifted in parallel in the longitudinal direction of the flat cross sectional shape of the flow path tube.

17 Claims, 30 Drawing Sheets

(56) References Cited

U.S. PATENT DOCUMENTS

2017/0051982 A1 2/2017 Takami et al.
2018/0112933 A1* 4/2018 Takagi ................. F28D 1/0333

FOREIGN PATENT DOCUMENTS

| JP | 2012083026 A | 4/2012 |
| JP | 2013088078 A | 5/2013 |
| JP | 2015227770 A | 12/2015 |
| JP | 5884055 B2 | 3/2016 |
| JP | 2016205802 A | 12/2016 |
| JP | 2018-074121 A | 5/2018 |
| JP | 6327271 B2 | 5/2018 |

* cited by examiner

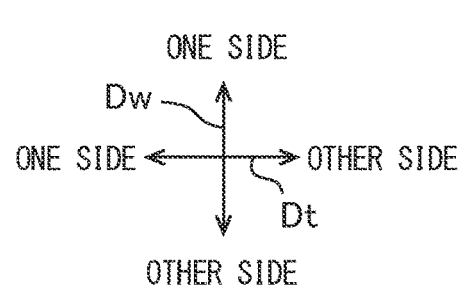
FIG. 30
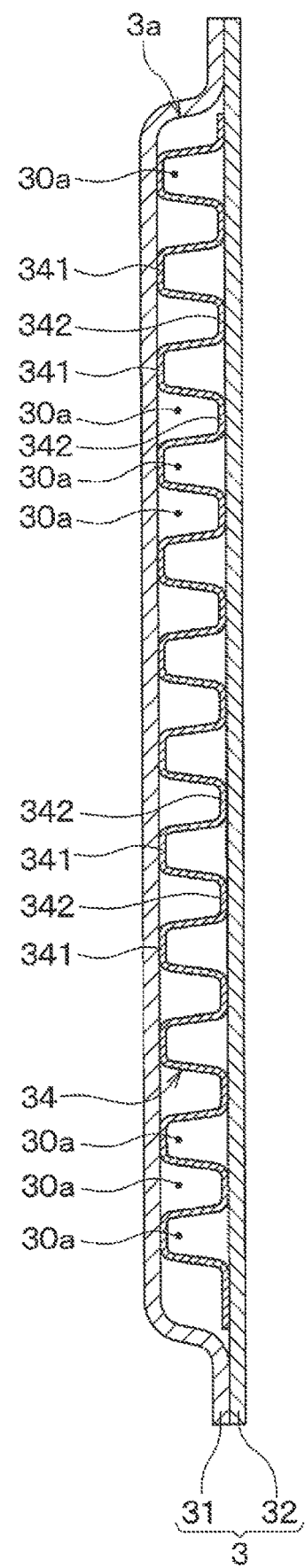

HEAT EXCHANGER

CROSS REFERENCE TO RELATED APPLICATION

The present application is a continuation application of International Patent Application No. PCT/JP2021/000516 filed on Jan. 8, 2021, which designated the U.S. and claims the benefit of priority from Japanese Patent Application No. 2020-025292 filed on Feb. 18, 2020. The entire disclosures of all of the above applications are incorporated herein by reference.

TECHNICAL FIELD

The present disclosure relates to a heat exchanger.

BACKGROUND

Conventionally, a heat exchanger has been used to causes heat exchange between a target of heat exchange and a heating medium.

SUMMARY

According to an aspect of the present disclosure, a heat exchanger is configured to cause heat exchange between a target of heat exchange and a heating medium.

BRIEF DESCRIPTION OF THE DRAWINGS

The above and other objects, features and advantages of the present disclosure will become more apparent from the following detailed description made with reference to the accompanying drawings. In the drawings:

FIG. 30 is a sectional view of a cross section taken along line III-III of FIG. 2 in relation to a tenth embodiment, equivalent to FIG. 3.

DETAILED DESCRIPTION

Figure 1:
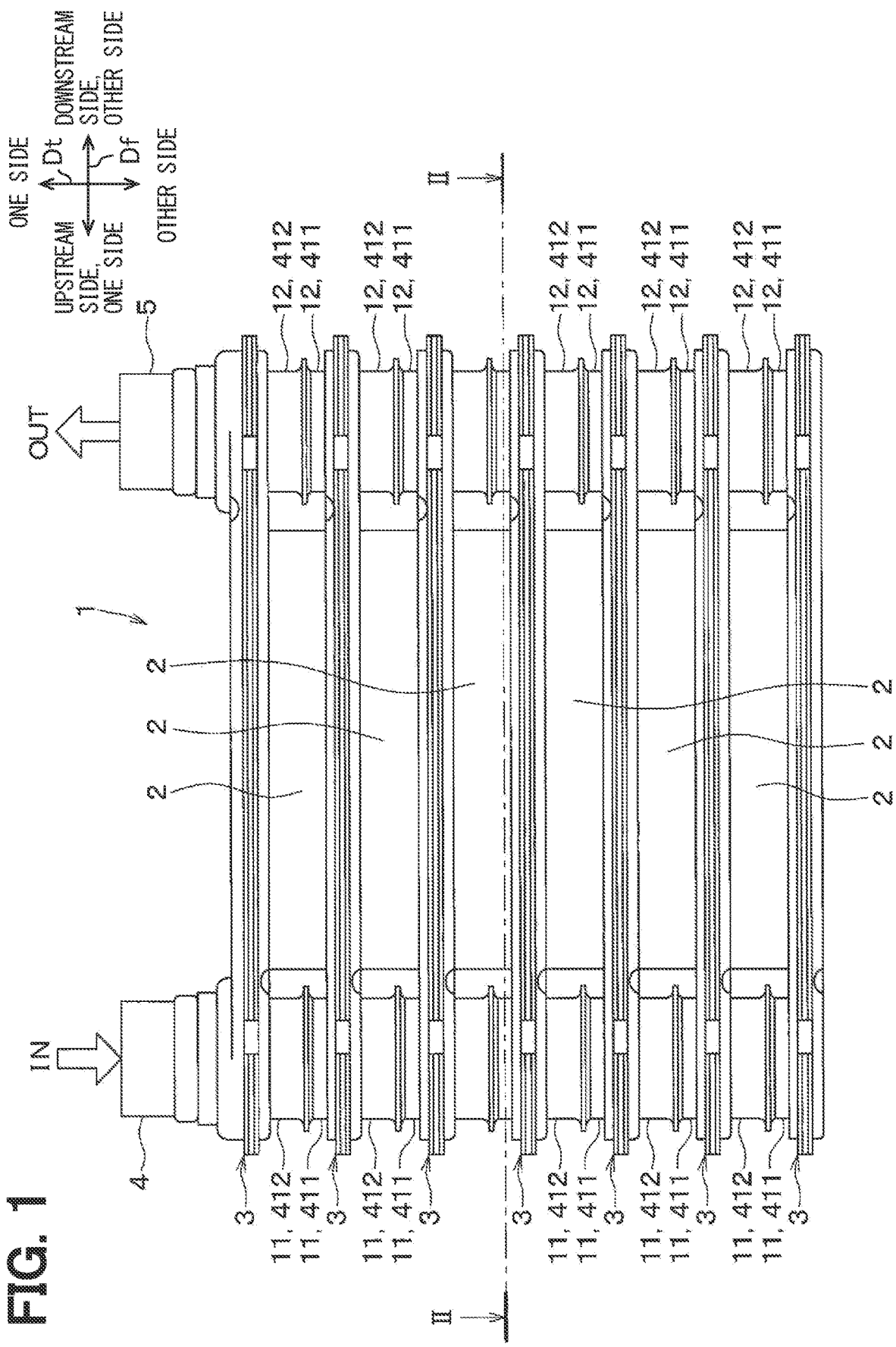
FIG. 1 is a front view schematically illustrating a configuration of a heat exchanger in a first embodiment.

Hereinafter, examples of the present disclosure will be described.

According to an example of the present disclosure, a heat exchanger includes a plurality of flow path tubes that sandwich a target of heat exchange, which is such a heating element as a semiconductor module with a semiconductor device incorporated, therebetween from both sides. Each of the flow path tubes has a flat cross sectional shape and the flow path tubes are stacked with a target of heat exchange in between. The heat exchanger causes heat exchange between a heating medium flowing through the flow path tubes and a target of heat exchange.

The heat exchanger includes an inner fin placed in the flow path tubes and configured as a wave fin. The inner fin divides the internal space of each flow path tube into a plurality of fine flow paths to increase an area of heat transfer between a target of heat exchange and the heating medium. An opening is partially formed in the inner fins and the opening couples together two fine flow paths adjacent to each other with an inner fin in between among the fine flow paths.

In the case of the heat exchanger, for example, when compression external force compressing a flow path tube is exerted in the thickness direction of a flat cross sectional shape of the flow path tube, an inner fin in the flow path tube functions to resist the compression external force. Meanwhile, since an opening is formed in the inner fin, it is concerned that the strength of the inner fin resisting the compression external force will be degraded.

According to an example of the present disclosure, in a heat exchanger, a shape of the opening represented as viewed in a direction opposed to the opening, that is, an opening shape of the opening is a shape of a triangle pointed to one side or the other side in the thickness direction of the flat cross sectional shape of a flow path tube. In the opening, of two sides forming the triangular shape and extended in the thickness direction, a length of one side is different from a length of the other side.

For this reason, for example, when compression external force is exerted on a flow path tube in the thickness direction and as a result, the periphery of the opening is deformed, the periphery of the opening is deformed. This deforming so occurs as to reduce a difference in length between a longer-side part equivalent to the longer side of the one side and the other side and a shorter-side part equivalent to the shorter side. In this case, therefore, in the periphery of the opening, the longer-side part is buckled earlier than the shorter-side part. That is, in the case of the heat exchanger, when the longer-side part and the shorter-side part in the periphery of an opening are buckled by compression external force as mentioned above, the parts differ from each other in the timing of buckling. For this reason, in the heat exchanger, the strength of each of the longer-side part and the shorter-side part cannot be sufficiently utilized and it is supposed that this is a cause of degradation in strength of the inner fin.

When the inner fins are so formed as to make finer the fine flow paths in the flow path tubes, the strength of the inner fins can be enhanced. However, as the fine flow paths are made more finer, a pressure drop is more increased in a heating medium flowing through the flow path tubes. As a result of close consideration, the present inventors found the foregoing.

To achieve the above object, according to an aspect of the present disclosure, a heat exchanger is configured to cause heat exchange between a target of heat exchange and a heating medium. The heat exchanger comprises a flow path tube having a flat cross sectional shape in a first cross section, which is perpendicular to one direction, and configured to cause the heating medium to flow therethrough, wherein an upstream side of a flow of the heating medium is one side in the one direction, wherein a downstream side of the flow of the heating medium is an other side in the one direction. The heat exchanger further comprises an inner fin placed in the flow path tube to divide an internal space of the flow path tube into a plurality of fine flow paths arranged in a longitudinal direction of the flat cross sectional shape, having, in the first cross section, a corrugated cross sectional shape in which a one-side protruded form, which is bulged to one side in a thickness direction of the flat cross sectional shape, and an other-side protruded form, which is bulged to an other side in the thickness direction, are alternately arranged and extended in the longitudinal direction, and extended in the one direction. In a second cross section perpendicular to the thickness direction, the inner fin has a meander shape in which a one-side top part, which is placed between the fine flow paths and bent to bulge to one side in the longitudinal direction, and an other-side top part, which is placed between the fine flow paths and bent to bulge to an other side in the longitudinal direction, are alternately arranged in the one direction via an intermediate part therebetween. The intermediate part includes a communication part having a communication port via which two of the fine flow paths, which are adjacent to each other via the inner fin, communicate with each other, one-side wall part extended from the one-side top part, which is adjacent to the communication part in the one direction, to the communication part and separating the two of the fine flow paths from each other, and an other-side wall part extended from the other-side top part, which is adjacent to the communication part in the one direction, to the communication part and separating the two of the fine flow paths from each other. The inner fin includes the communication part that is one or more. The communication port is placed in the intermediate part and away from the one-side top part and the other-side top part. A periphery of the communication port includes an edge of the one-side wall part and an edge of the other-side wall part. The edge of the one-side wall part is formed such that the edge of the other-side wall part is shifted in parallel in the longitudinal direction.

With this configuration, an edge of a one-side wall part and an edge of the other-side wall part are substantially identical in length. For this reason, when the edge of the one-side wall part and the edge of the other-side wall part are buckled by the above-mentioned compression external force exerted on the flow path tubes in the thickness direction, the edges are matched with each other in the timing of buckling. As a result, degradation in strength of inner fins due to provision of a communication part can be suppressed without necessity for making finer the fine flow paths in the flow path tube.

According to another aspect of the present disclosure, a heat exchanger is configured to cause heat exchange between a target of heat exchange and a heating medium. The heat exchanger comprises a flow path tube having a flat cross sectional shape in a first cross section, which is perpendicular to one direction, and configured to cause the heating medium to flow therethrough, wherein an upstream side of a flow of the heating medium is one side in the one direction, wherein a downstream side of the flow of the heating medium is an other side in the one direction. The heat exchanger further comprises an inner fin placed in the flow path tube to divide an internal space of the flow path tube into a plurality of fine flow paths arranged in a longitudinal direction of the flat cross sectional shape, having, in the first cross section, a corrugated cross sectional shape in which a one-side protruded form, which is bulged to one side in a thickness direction of the flat cross sectional shape, and an other-side protruded form, which is bulged to an other side in the thickness direction, are alternately arranged and extended in the longitudinal direction, and extended in the one direction. In a second cross section perpendicular to the thickness direction, the inner fin has a meander shape in which a one-side top part, which is placed between the fine flow paths and bent to bulge to one side in the longitudinal direction, and an other-side top part, which is placed between the fine flow paths and bent to bulge to an other side in the longitudinal direction, are alternately arranged in the one direction via an intermediate part therebetween. The intermediate part is in a shape of a wall that separates two of the fine flow paths, which are adjacent to each other via the inner fin, from each other and includes a cut and raised part. The cut and raised part is in a shape of cut and raised to form a through hole penetrating the intermediate part on the one side or the other side in the one direction relative to the cut and raised part. The inner fin includes the through hole, which is one or more and the cut and raised part, which is one or more.

With this configuration, a cut and raised part also resists compression external force exerted on the flow path tubes in the thickness direction. Therefore, the inner fins can be so formed that an intermediate part thereof is less prone to buckle in the thickness direction. As a result, degradation in strength of inner fins due to provision of a through hole in an intermediate part thereof can be suppressed without necessity for making finer the fine flow paths in flow path tubes. In addition, the through hole in the intermediate part is capable of enhancing heat exchange performance.

Hereafter, a description will be given to embodiments with reference to the drawings. Between the following embodiments, identical or equivalent elements are marked with identical reference numerals and symbols in the drawings.

First Embodiment

As shown in FIG. 1, in the present embodiment, a heat exchanger 1 is used as a heat extractor cooling a plurality of electronic components 2. This heat exchanger 1 is a multi-layered heat exchanger in which a plurality of flow path tubes 3 are stacked and placed. The heat exchanger 1 causes heat exchange between a heating medium flowing through the flow path tubes 3 and the electronic components 2 and thereby cools the electronic components 2 as a target of heat exchange. An example of the electronic components 2 is a component constituting a part of such a power conversion device as an inverter circuit that is mounted in a vehicle and converts a direct current into an alternating current.

Figure 2:
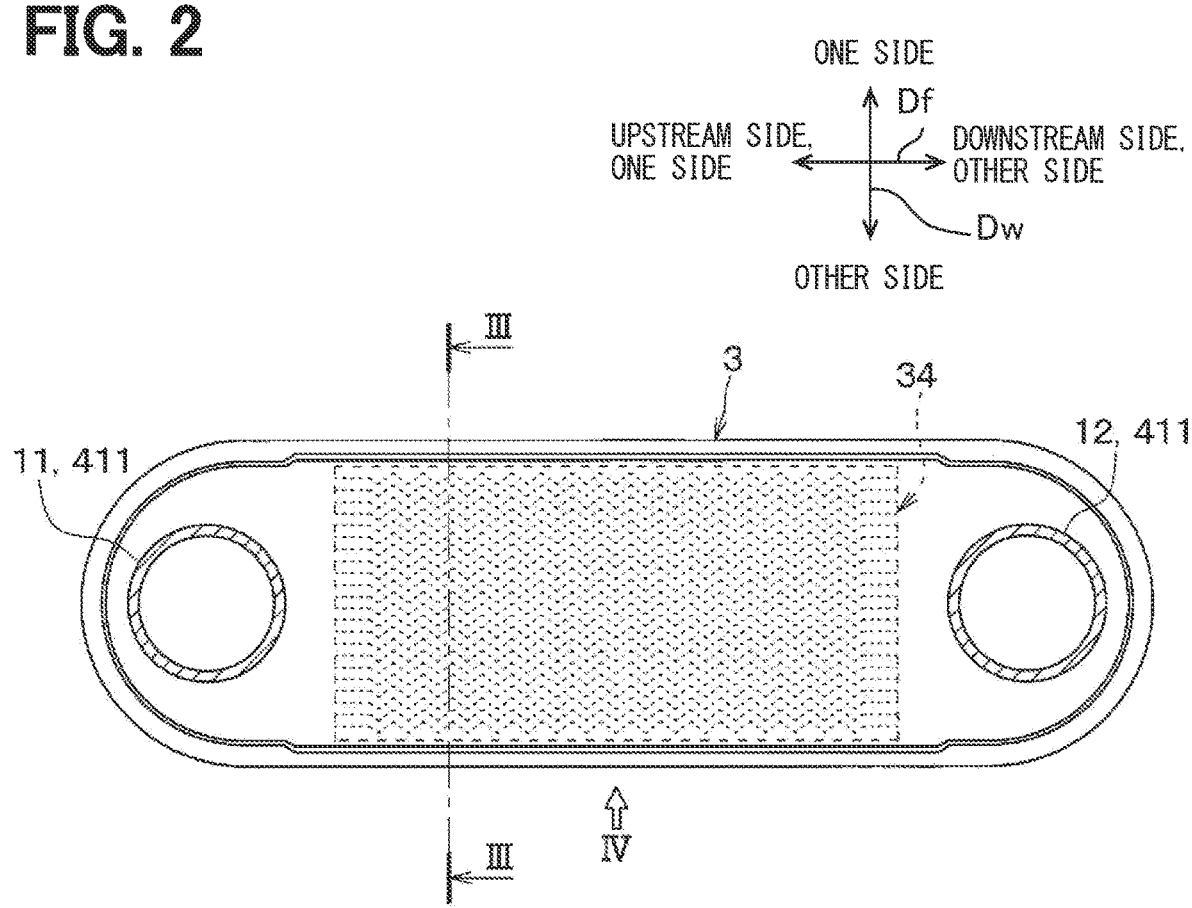
FIG. 2 is a sectional view of a cross section taken along line II-II of FIG. 1 in relation to the first embodiment.
Figure 3:
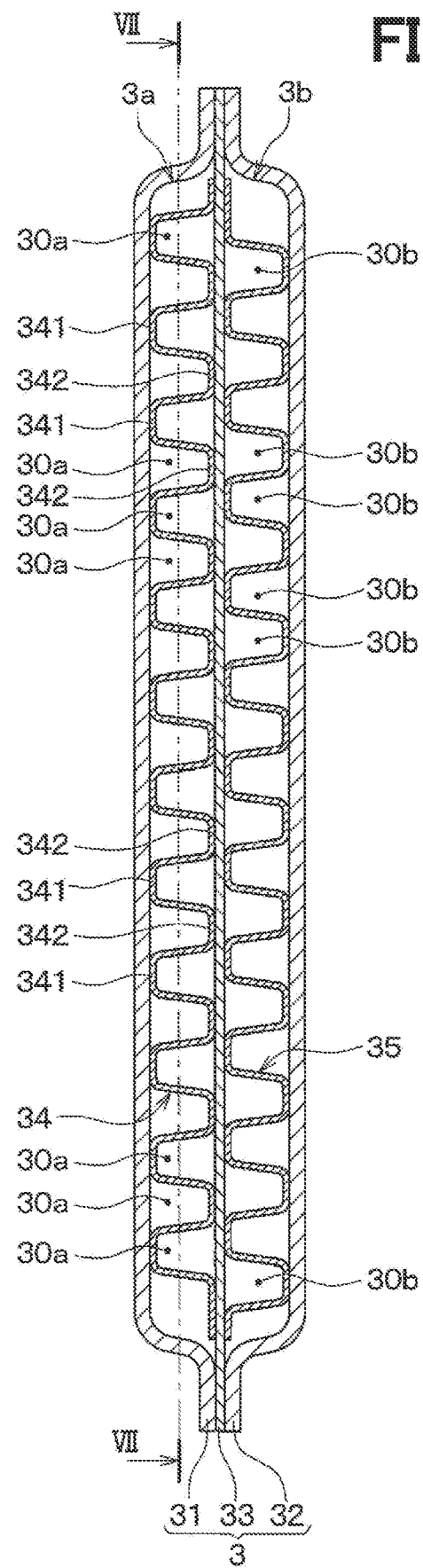
FIG. 3 is a sectional view of a cross section (that is, first section) taken along line III-III of FIG. 2 in relation to the first embodiment.

As shown in FIG. 1 to FIG. 3, the heat exchanger 1 includes the flow path tubes 3, a plurality of first inner fins 34, and a plurality of second inner fins 35.

In each flow path tube 3, the heating medium exchanging heat with the electronic components 2 flows. A detailed description will be given. With respect to each of the flow path tubes 3, one side in an in-tube flow direction Df as one direction Df is taken as the upstream side of a heating medium flow and the other side in the in-tube flow direction Df is taken as the downstream side of the heating medium flow. The heating medium flows in the flow path tubes 3. For example, the in-tube flow direction Df agrees with the longitudinal direction of each flow path tube 3. As shown in FIG. 2, for example, in each flow path tube 3, a pair of periphery parts in the transverse direction are extended in parallel along the longitudinal direction and a shape of each periphery end in the longitudinal direction is semicircular. The transverse direction of each flow path tube 3 in the present embodiment is a direction perpendicular to the in-tube flow direction Df in FIG. 2.

The heating medium exchanging heat with each electronic component 2 is a liquid in the present embodiment. For example, water mixed with ethylene glycol antifreeze, such a natural refrigerant as water or ammonia, or the like can be used as the heating medium.

The flow path tube 3 has a flat cross sectional shape as viewed in a first cross section (that is, a cross section shown in FIG. 3) perpendicular to the in-tube flow direction Df. As shown in FIG. 1 to FIG. 3, the flow path tube 3 is extended in the in-tube flow direction Df while maintaining the flat cross sectional shape. In the present embodiment, the longitudinal direction Dw of the flat cross sectional shape of the flow path tube 3 shown in the cross section in FIG. 3 is designated as flat longitudinal direction Dw and the thickness direction Dt of the flat cross sectional shape (in other words, the transverse direction Dt of the flat cross sectional shape) is designated as flat thickness direction Dt. The flat longitudinal direction Dw, the flat thickness direction Dt, and the in-tube flow direction Df are directions intersecting one another, strictly, directions perpendicular to one another.

In the heat exchanger 1, a plurality of the flow path tubes 3 are stacked in the flat thickness direction Dt with an electronic component 2 sandwiched therebetween. In other words, a flow path tube 3 and an electronic component 2 are alternately lined and stacked in the flat thickness direction Dt. Therefore, the flat thickness direction Dt is also a direction of lamination in which the flow path tubes 3 are stacked.

To enhance a heat transfer property between a flow path tube 3 and an electronic component 2 in contact with that flow path tube 3, the electronic component 2 is pressed in the flat thickness direction Dt by a pair of flow path tubes 3 sandwiching the electronic component 2 therebetween and is held pressed.

FIG. 2 is a sectional view of a cross section taken along line II-II of FIG. 1 but in FIG. 2, an illustration of an electronic component 2 is omitted for clarifying a shape of the flow path tube 3. In FIG. 2, a first inner fin 34 placed in the flow path tube 3 is indicated by a broken line. In FIG. 2, FIG. 3, FIG. 5, FIG. 6, FIG. 16, and drawings equivalent to these drawings, an illustration of a communication part 364, described later, is omitted for the sake of simplification.

The flow path tube 3 is formed by stacking plate members made of such a metal as an aluminum alloy or a copper alloy high in thermal conductivity and joining these plate members. As shown FIG. 3 and FIG. 4, specifically, the flow path tube 3 includes a pair of shell plates 31, 32 and an intermediate plate 33. For example, in an area of contact between a pair of the shell plates 31, 32, the intermediate plate 33, the first inner fin 34, and the second inner fin 35, the members in contact with each other are joined together by brazing.

The shell plates 31, 32 are board members constituting the shells of the flow path tube 3 and heat is exchanged between an electronic component 2 and the heating medium by way of the shell plates 31, 32. Specifically, a first shell plate 31 that is one of a pair of shell plates 31, 32 is placed on one side of a second shell plate 32 that is the other of the pair in the flat thickness direction Dt. The first shell plate 31 is stacked on the second shell plate 32 in the flat thickness direction Dt so that in-tube flow paths 3a, 3b as an internal space of the flow path tube 3 are formed between the first shell plate and the second shell plate 32.

The intermediate plate 33 is formed of a flat board member. The intermediate plate 33 is placed between a pair of shell plates 31, 32, and divides the internal space of the flow path tube 3 in the flat thickness direction Dt and is extended in the in-tube flow direction Df. As shown in FIG.

5, through holes 33a, 33b are respectively formed at one end and the other end of the intermediate plate 33 in correspondence with openings in protruded tubular parts 411, 412, described later. The first inner fin 34 and the second inner fin 35 are placed in a flow path tube 3 and between the two through holes 33a, 33b in the in-tube flow direction Df.

As shown in FIG. 2 and FIG. 3, one first inner fin 34 and one second inner fin 35 are provided in each flow path tube 3. Both of the first inner fin 34 and the second inner fin 35 are components that increase an area of heat transfer between electronic components 2 and the heating medium in the flow path tubes 3 and facilitate heat exchange between the electronic components 2 and the heating medium. The first inner fin 34 and the second inner fin 35 are formed, for example, by pressing a metal plate of an aluminum alloy or the like high in thermal conductivity.

The first inner fin 34 and the second inner fin 35 are identical components but different in place of disposition. That is, while the first inner fin 34 is placed in the in-tube flow path 3a formed between the first shell plate 31 and the intermediate plate 33, the second inner fin 35 is placed in the in-tube flow path 3b formed between the second shell plate 32 and the intermediate plate 33. In other words, in the flow path tube 3, the first inner fin 34 is placed on one side of the intermediate plate 33 in the flat thickness direction Dt and the second inner fin 35 is placed on the other side of the intermediate plate 33 in the flat thickness direction Dt.

Therefore, the first inner fin 34 divides the in-tube flow path 3a that is an internal space of the flow path tube 3 into a plurality of fine flow paths 30a arranged in the flat longitudinal direction Dw. Similarly, the second inner fin 35 divides the in-tube flow path 3b that is an internal space of the flow path tube 3 into a plurality of fine flow paths 30b arranged in the flat longitudinal direction Dw.

The second inner fin 35 is placed in such an orientation that the first inner fin 34 is inverted in the flat thickness direction Dt. The second inner fin 35 is identical with the first inner fin 34 except that an orientation and a place of disposition thereof are different from those of the first inner fin 34. For example, a communication part 364, described later, provided in the first inner fin 34 is also provided in the second inner fin 35 in the same configuration as in the first inner fin 34. Therefore, in relation to the present embodiment, a description will be basically given to the first inner fin 34 and a description of the second inner fin 35 will be omitted.

Figure 6:
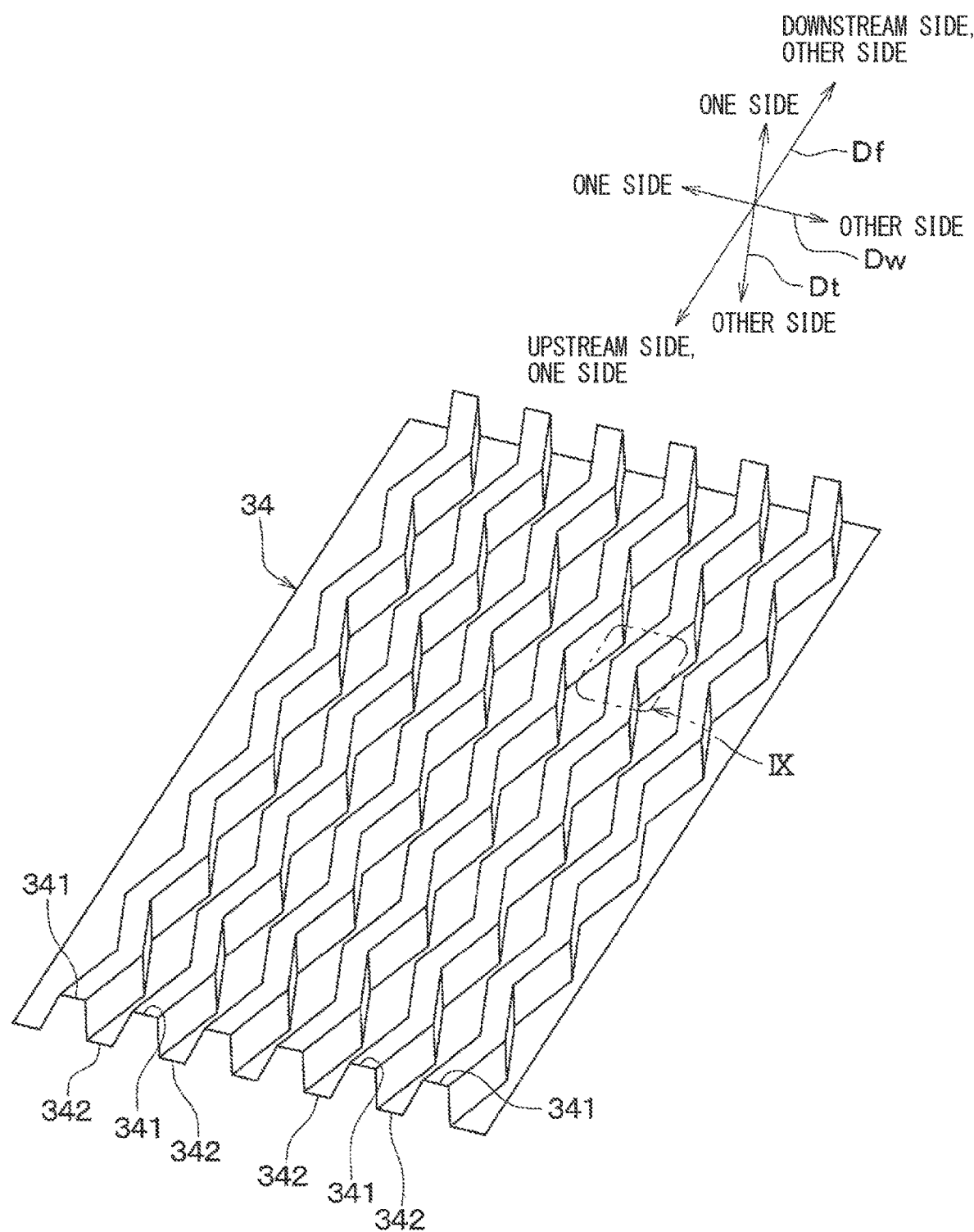
FIG. 6 is a perspective view illustrating an area where a meander shape of a first inner fin is formed in the first embodiment in an excerpted manner.

As shown in FIG. 3, the first inner fin 34 forms a corrugated cross sectional shape as viewed in the above-mentioned first section. In the corrugated cross sectional shape, a one-side protruded form 341 bulged to one side in the flat thickness direction Dt and the other-side protruded form 342 bulged to the other side in the flat thickness direction Dt are alternately arranged and extended in the flat longitudinal direction Dw. As shown in FIG. 2 and FIG. 6, the first inner fin 34 is extended in the in-tube flow direction Df in the in-tube flow path 3a.

For example, the first inner fin 34 forms shapes of a plurality of the fine flow paths 30a as viewed in the above-mentioned first cross section as shown in FIG. 3. That is, the first inner fin 34 divides the in-tube flow path 3a so that the fine flow path 30a that is more increased in width in the flat longitudinal direction Dw as it goes farther to one side in the flat thickness direction Dt and the fine flow path 30a that is more increased in width in the flat longitudinal direction Dw as it goes farther to the other side in the flat thickness direction Dt are alternately arranged in the flat longitudinal direction Dw.

In other words, as viewed in the above-mentioned first cross section, one of two fine flow paths 30a adjacent to each other in the flat longitudinal direction Dw has a trapezoidal cross sectional shape in which the fine flow path is wider on the other side in the flat thickness direction Dt than on one side in the flat thickness direction Dt. The other of the two adjacent fine flow paths 30a has a trapezoidal cross sectional shape in which the fine flow path is wider on the one side in the flat thickness direction Dt than on the other side in the flat thickness direction Dt.

Figure 4:
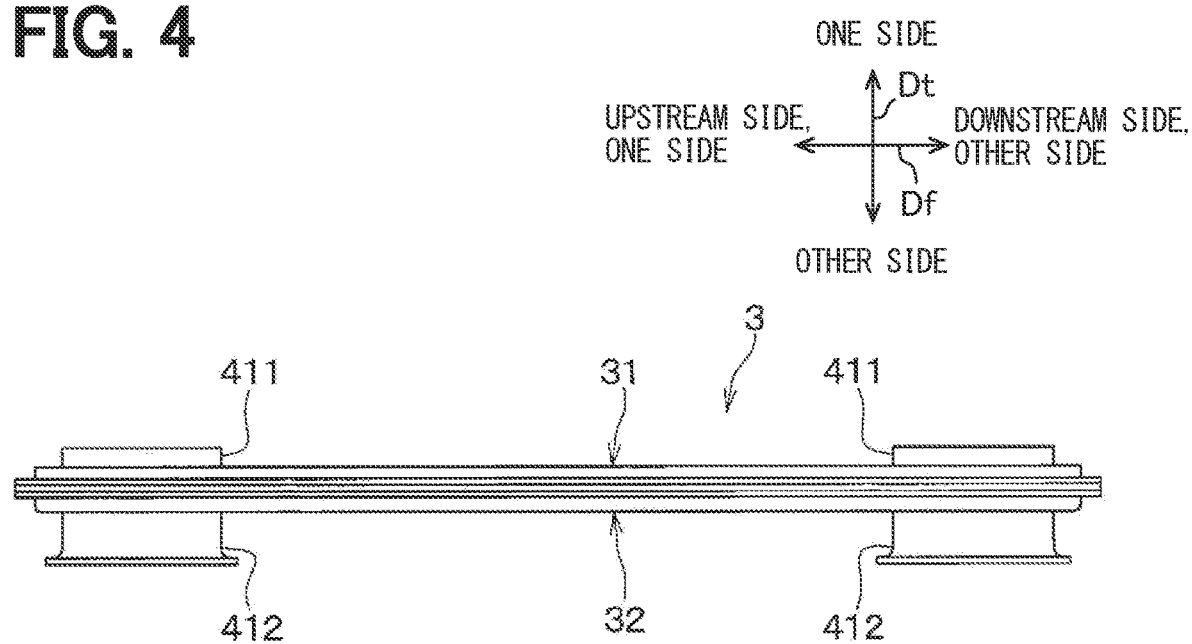
FIG. 4 is a drawing illustrating a single flow path tube as viewed in the direction of arrow IV of FIG. 2.
Figure 5:
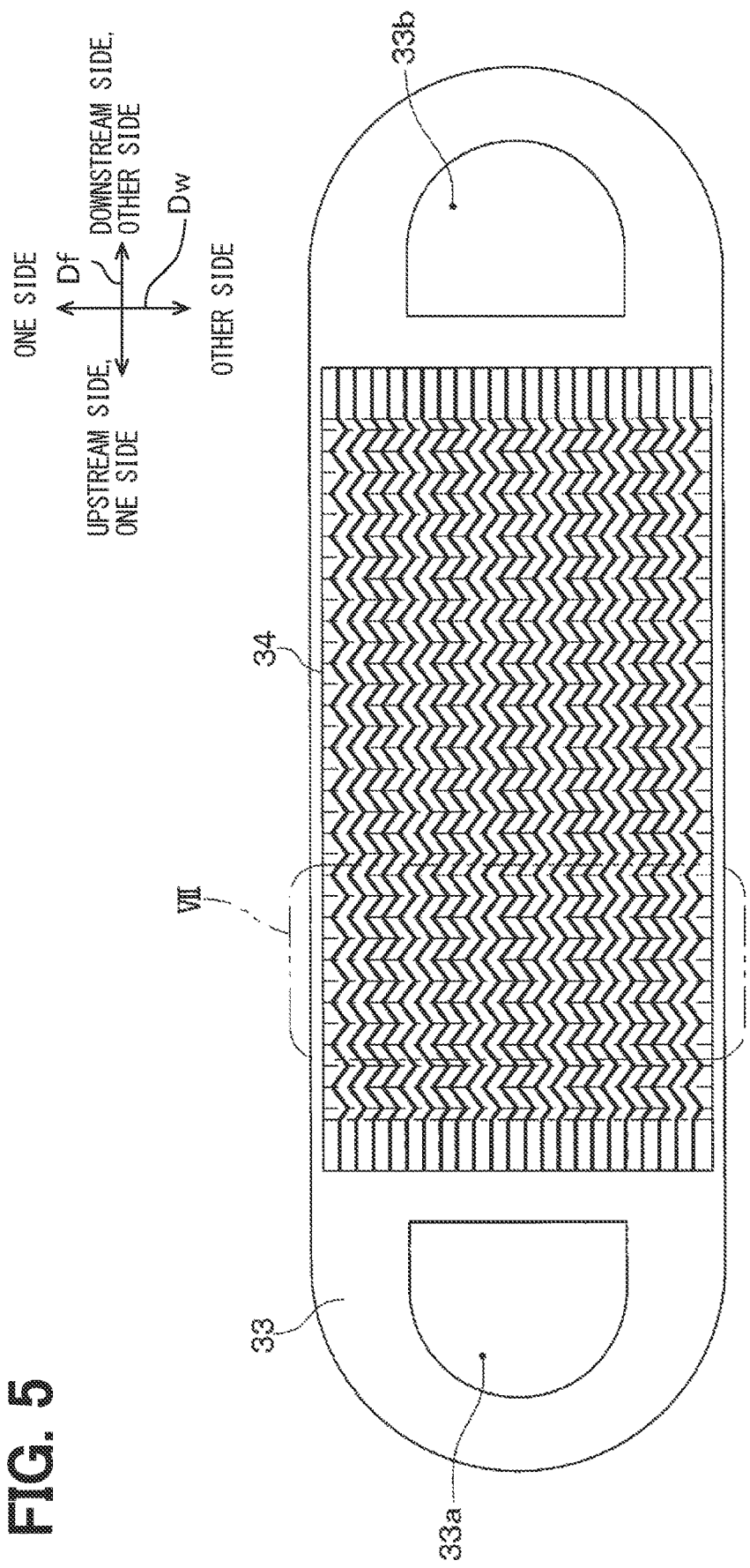
FIG. 5 is a drawing illustrating an intermediate plate and a first inner fin in the first embodiment in an excerpted manner as viewed in a direction from one side toward the other side in the flat thickness direction, showing how the first inner fin is mounted on the intermediate plate.

As shown in FIG. 1, FIG. 2, and FIG. 4, the heat exchanger 1 includes a plurality of the protruded tubular parts 411, 412. The protruded tubular parts 411, 412 are respectively provided at ends of a flow path tube 3 on one side and the other side in the in-tube flow direction Df and are so formed as to protrude from the flow path tube 3 in the flat thickness direction Dt. For example, one-side protruded tubular part 411 protruded to one side in the flat thickness direction Dt constitutes a single component together with a first shell plate 31; and the other-side protruded tubular part 412 protruded to the other side in the flat thickness direction Dt constitutes a single component together with a second shell plate 32.

Each of the protruded tubular parts 411, 412 is a tube coupling together flow path tubes 3 adjacent to each other in the flat thickness direction Dt and is formed, for example, in a cylindrical shape. For example, a one-side protruded tubular part 411 and the other-side protruded tubular part 412 provided at ends of flow path tubes 3 on one side in the in-tube flow direction Df are so placed that the protruded tubular parts are coaxially aligned. Similarly, a one-side protruded tubular part 411 and the other-side protruded tubular part 412 provided at ends of flow path tubes 3 on the other side in the in-tube flow direction Df are also so placed that the protruded tubular parts are coaxially aligned.

A more detailed description will be given. Of the lined flow path tubes 3 constituting the heat exchanger 1, each flow path tube 3, except a pair of flow path tubes 3 positioned in outermost positions in the flat thickness direction Dt, is provided with a pair of one-side protruded tubular parts 411 and a pair of the other-side protruded tubular parts 412 as well.

Of the lined flow path tubes 3, the flow path tube 3 positioned at an end on one side in the flat thickness direction Dt is provided with a pair of the other-side protruded tubular parts 412 but is not provided with a one-side protruded tubular part 411. Of the lined flow path tubes 3, the flow path tube 3 positioned at an end on the other side in the flat thickness direction Dt is provided with a pair of one-side protruded tubular parts 411 but is not provided with the other-side protruded tubular part 412.

The flow path tubes 3 are coupled with one another by fitting together protruded tubular parts 411, 412 opposed to each other and joining together side walls of the protruded tubular parts 411, 412. As a result, in-tube flow paths 3a, 3b provided in one of flow path tubes 3 adjacent to each other in the flat thickness direction Dt communicate to in-tube flow paths 3a, 3b provided in the other of the adjacent flow path tubes 3 (refer to FIG. 3). Side walls of the protruded tubular parts 411, 412 are joined together, for example, by brazing.

As shown in FIG. 1, a medium guide-in part 4 is a tube for guiding the heating medium into the heat exchanger 1 and a medium guide-out part 5 is a tube for guiding the heating medium out of the heat exchanger 1. The heat exchanger 1 is provided with the medium guide-in part 4 and the medium guide-out part 5.

The medium guide-in part 4 and the medium guide-out part 5 are connected to the flow path tube 3 positioned at an end of the lined flow path tubes 3 on one side in the flat thickness direction Dt. In detail, the medium guide-in part 4 is connected to an end of the flow path tube 3 on one side in the in-tube flow direction Df and is so placed as to coaxially align with the other-side protruded tubular part 412 provided at an end on the one side. The medium guide-out part 5 is connected to an end of the flow path tube 3 on the other side in the in-tube flow direction Df and is so placed as to coaxially align with the other-side protruded tubular part 412 provided at the end on the other side. The medium guide-in part 4 and the medium guide-out part 5 are respectively joined to the flow path tube 3 by brazing.

Since the medium guide-in part 4 and the medium guide-out part 5 are connected to the flow path tubes 3 as mentioned above, the protruded tubular parts 411, 412 provided at ends of the flow path tubes 3 on one side in the in-tube flow direction Df constitute feeding header parts 11. The protruded tubular parts 411, 412 provided at ends of the flow path tubes 3 on the other side in the in-tube flow direction Df constitute discharging header parts 12. The feeding header parts 11 are tubes that feed the heating medium into the in-tube flow paths 3a, 3b of the flow path tubes 3 (refer to FIG. 3) and the discharging header parts 12 are tubes that discharge the heating medium from the in-tube flow paths 3a, 3b of the flow path tubes 3.

The heating medium is fed from a pump, not shown, to the heat exchanger 1 by way of the medium guide-in part 4 and is simultaneously discharged from the heat exchanger 1 by way of the medium guide-out part 5 and returned to the pump.

Figure 7:
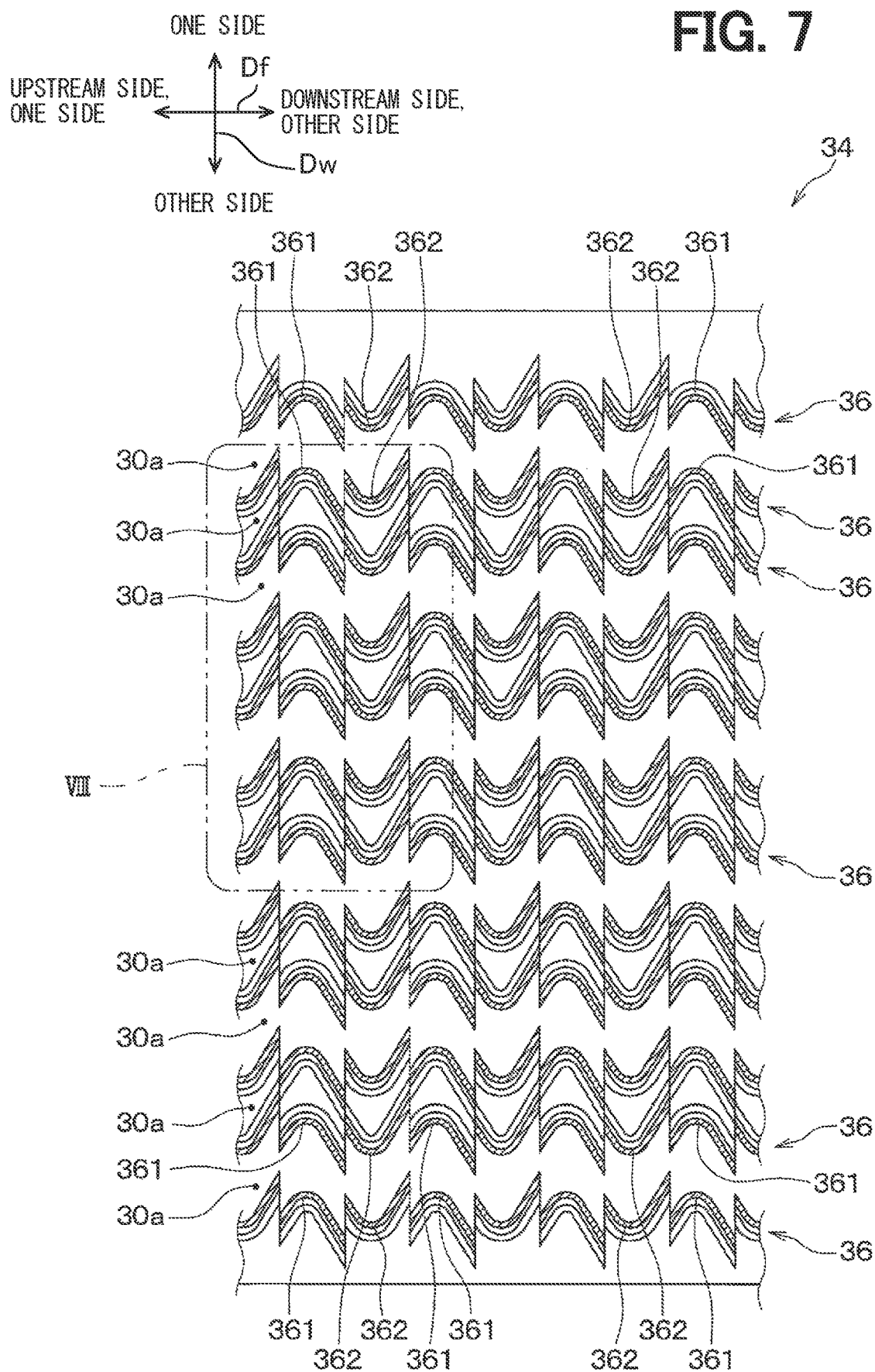
FIG. 7 is a sectional view illustrating a first inner fin in the first embodiment as viewed in the same direction as in FIG. 5, showing the part of VII in FIG. 5 as viewed in a second cross section perpendicular to the flat thickness direction.
Figure 8:
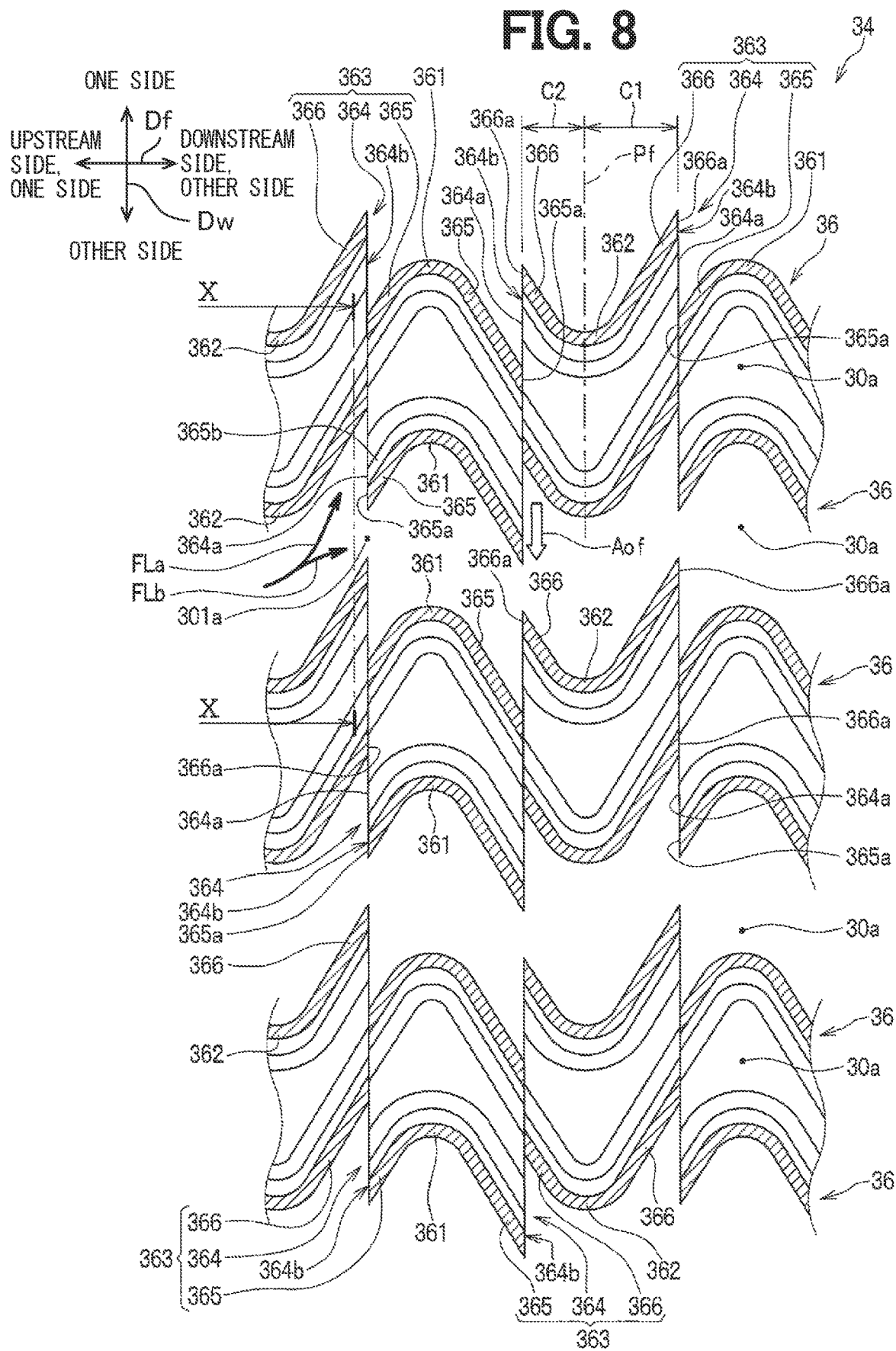
FIG. 8 is an enlarged sectional view illustrating the part of VIII in FIG. 7 in relation to the first embodiment in an enlarged manner.

As mentioned above, the first inner fin 34 forms a corrugated cross sectional shape as viewed in the above-mentioned first section. In addition, as shown in FIG. 7 and FIG. 8, the first inner fin 34 forms a meander shape 36 as viewed in a second cross section (that is, the cross section in FIG. 7) perpendicular to the flat thickness direction Dt. In short, the first inner fin 34 is configured as a wave fin.

The meander shape 36 of the first inner fin 34 is a shape in which a one-side top part 361 and the other-side top part 362 are alternately arranged in the in-tube flow direction Df with an intermediate part 363 in between as viewed in the above-mentioned second section. The one-side top part 361 is a diaphragm part placed between fine flow paths 30a (refer to FIG. 3) and has a protruded shape in which the one-side top part is bent and bulged to one side in the flat longitudinal direction Dw as viewed in the second section. The other-side top part 362 is a diaphragm part placed between fine flow paths 30a and has a protruded shape in which the other-side top part is bent and bulged to the other side in the flat longitudinal direction Dw as viewed in the above-mentioned second section.

Further, the first inner fin 34 is provided with a plurality of meander shapes 36 in which a one-side top part 361 and the other-side top part 362 are strung out in the in-tube flow direction Df with an intermediate part 363 in between and that are arranged in parallel in the flat longitudinal direction Dw. As mentioned above, the first inner fin 34 includes a plurality of one-side top parts 361, a plurality of the other-side top parts 362, and a plurality of intermediate parts 363 that constitute a meander shape 36. FIG. 7 shows a cross section taken along line VIIa-VIIa of FIG. 3.

Figure 9:
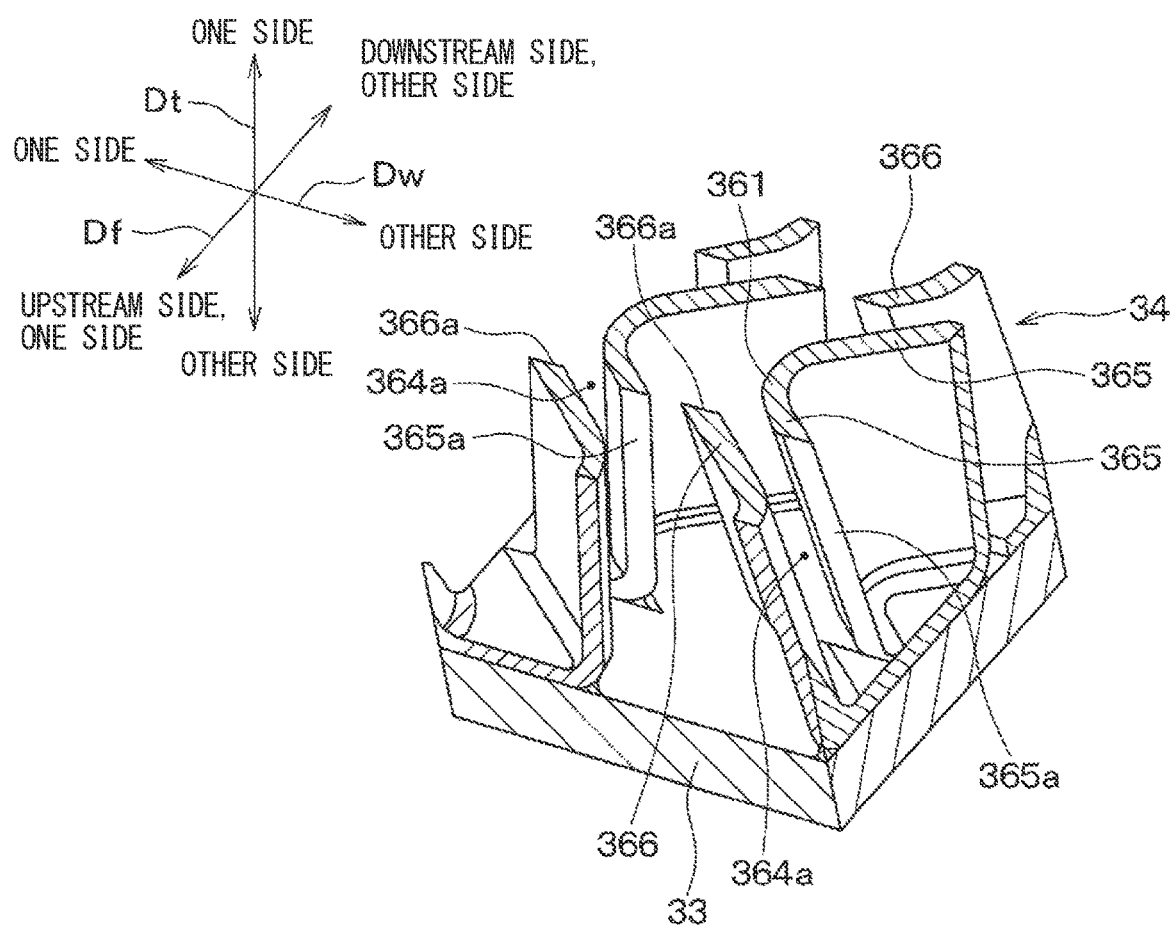
FIG. 9 is a perspective view showing a cross section of a first inner fin in the part of IX in FIG. 6.

As shown in FIG. 8 and FIG. 9, the intermediate part 363 of a first inner fin 34 is not configured as a diaphragm that is continuously connected between a one-side top part 361 and the other-side top part 362. A more specific description will be given. The intermediate part 363 includes a communication part 364 with a communication port 364a formed therein, a one-side wall part 365, and the other-side wall part 366. The communication port 364a is formed as a hole open toward the in-tube flow direction Df and causes two fine flow paths 30a adjacent to each other with the first inner fin 34 in between, among the fine flow paths 30a, to communicate with each other.

A description will be given to the meander shape 36 in FIG. 8 relative to a one-side top part 361. A communication part 364 and a one-side wall part 365 are provided at the one-side top part 361 on one side in the in-tube flow direction Df and a communication part 364 and a one-side wall part 365 are provided also on the other side. The one-side wall part 365 is extended from the one-side top part 361 adjacent to a communication part 364 in the in-tube flow direction Df to the communication part 364 and separates two adjacent fine flow paths 30a from each other.

A description will be given to the meander shape 36 in FIG. 8 relative to the other-side top part 362. A communication part 364 and the other-side wall part 366 are provided at the other-side top part 362 on one side in the in-tube flow direction Df and a communication part 364 and the other-side wall part 366 are provided also on the other side. The other-side wall part 366 is extended from the other-side wall part 366 adjacent to a communication part 364 in the in-tube flow direction Df to the communication part 364 and separates two adjacent fine flow paths 30a from each other.

As shown in FIG. 8 and FIG. 9, each of the communication ports 364a is placed in an intermediate part 363 away from each of a one-side top part 361 and the other-side top part 362. In other words, each of the communication ports 364a is not provided in either a one-side top part 361 or the other-side top part 362 and is provided between a one-side top part 361 and the other-side top part 362 in the in-tube flow direction Df.

For example, in the present embodiment, a communication port 364a is not provided in any of all the one-side top parts 361 and all the other-side top parts 362 provided in a first inner fin 34. The communication port 364a is formed in each of the intermediate parts 363 arranged in the in-tube flow direction Df.

Figure 10:
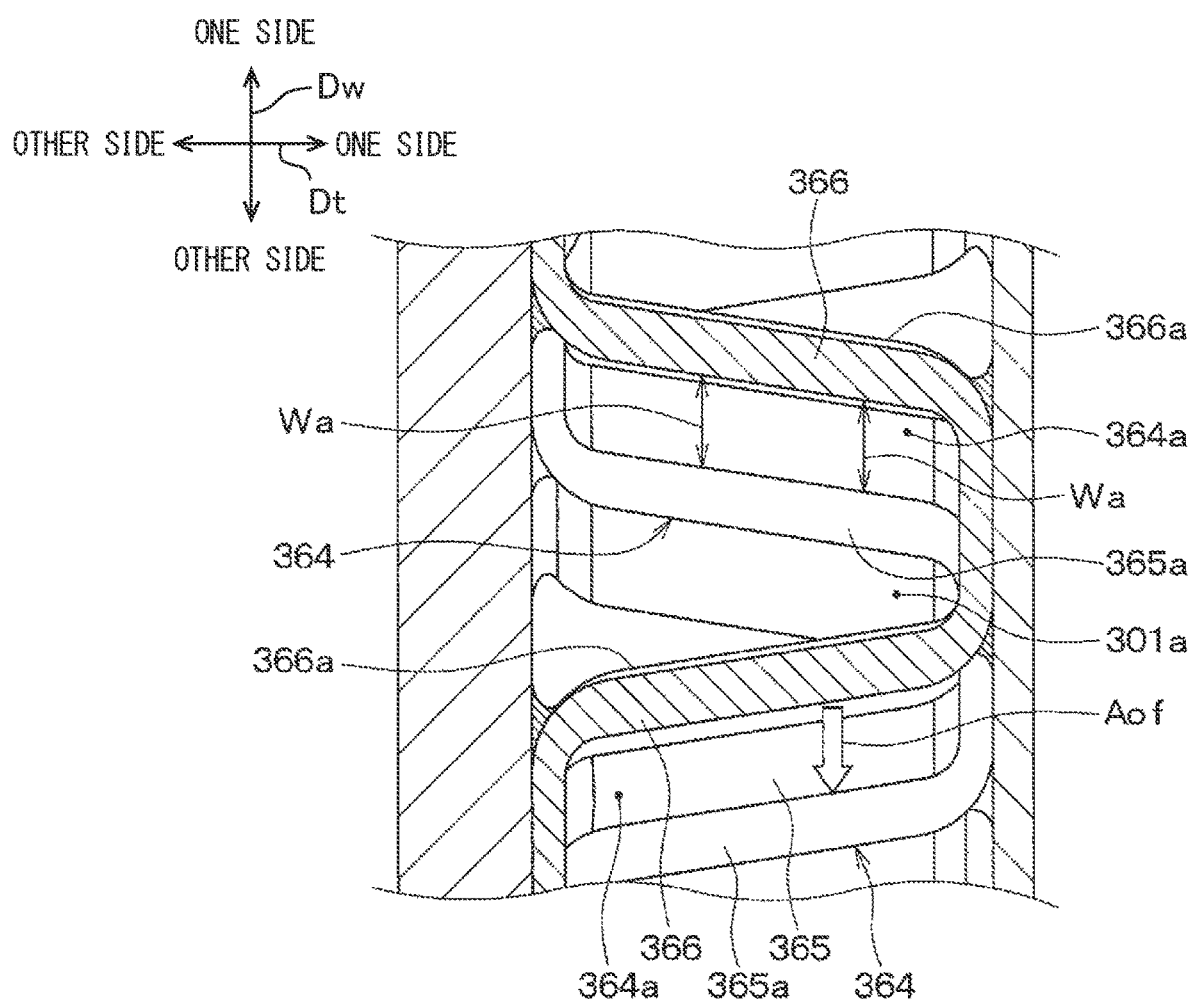
FIG. 10 is a sectional view illustrating a cross section taken along line X-X of FIG. 8 in relation to the first embodiment.

A description will be given to an opening shape of the communication port 364a. As shown in FIG. 8 and FIG. 10, the communication part 364 includes a periphery 364b of a communication port 364a. The periphery 364b of the communication port 364a includes an edge 365a of a one-side wall part 365 and an edge 366a of the other-side wall part 366. The edge 365a of the one-side wall part 365 is placed on the opposite side of the one-side wall part 365 to the one-side top part 361 side and the edge 366a of the other-side wall part 366 is placed on the opposite side of the other-side wall part 366 to the other-side top part 362 side.

The edge 365a of the one-side wall part 365 is formed such that the edge 366a of the other-side wall part 366 is shifted in parallel in the flat longitudinal direction Dw. Directly speaking, the edge 365a of the one-side wall part 365 is in a shape obtained by shifting in parallel the edge 366a of the other-side wall part 366 in the flat longitudinal direction Dw. In more detail, the edge 365a of the one-side wall part 365 forms a shape obtained by shifting in parallel the edge 366a of the other-side wall part 366 to the other side in the flat longitudinal direction Dw as indicated by the arrow Aof. When attention is paid to individual communication parts 364, in each of the communication parts 364, the edge 365a of the one-side wall part 365 is placed on the other side of the edge 366a of the other-side wall part 366 in the flat longitudinal direction Dw.

Figure 11:
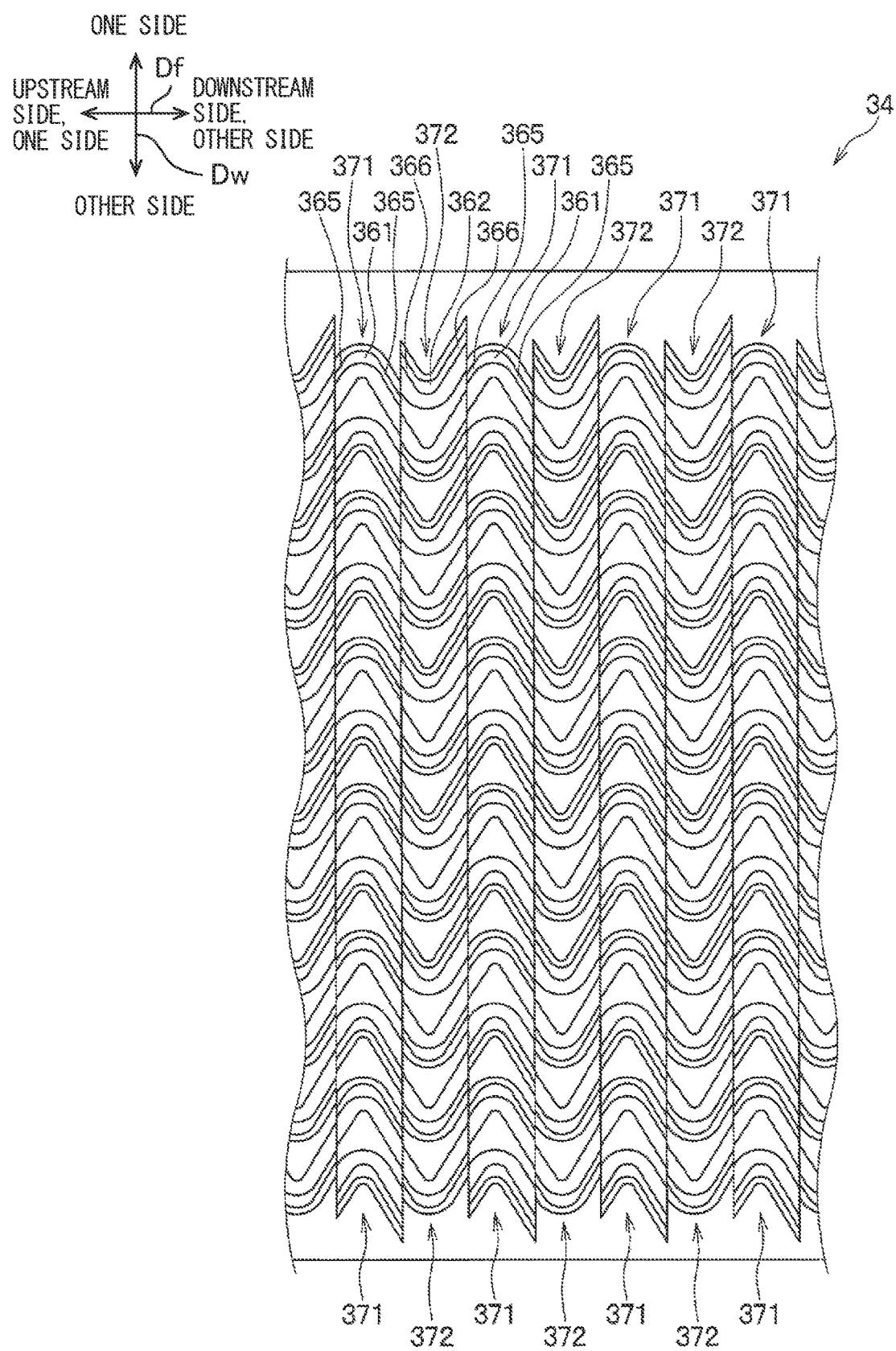
FIG. 11 is a top view illustrating a first inner fin in the first embodiment in an excerpted manner, showing the part of VII in FIG. 5 as viewed in the same direction as in FIG. 5.

When a shape of the first inner fin 34 is described in other words, as shown in FIG. 10 and FIG. 11, the first inner fin 34 is configured as an offset fin having a predetermined offset shape. The offset shape is a shape obtained by shifting in parallel a first protruded portion 371 relative to a second protruded portion 372 so that a communication port 364a is increased in width in the flat longitudinal direction Dw. In detail, the offset shape is a shape obtained by shifting in parallel the first protruded portion 371 to the other side in the flat longitudinal direction Dw relative to the second protruded portion 372 so that the communication port 364a is increased in width in the flat longitudinal direction Dw.

The first protruded portion 371 is a portion including a one-side top part 361 and a pair of one-side wall parts 365 arranged in the in-tube flow direction Df with the one-side top part 361 in between. Meanwhile, the second protruded portion 372 is a portion including the other-side top part 362 and a pair of the other-side wall parts 366 arranged in the in-tube flow direction Df with the other-side top part 362 in between. The first protruded portion 371 and the second protruded portion 372 are lined and alternately placed in the in-tube flow direction Df.

As viewed in the cross section in FIG. 8 as the above-mentioned second cross section, a one-side top part 361 placed between two communication ports 364a adjacent to each other in the in-tube flow direction Df is placed with a deviation to one side in the in-tube flow direction Df between the two adjacent communication ports 364a. This is also the same with a disposition of the other-side top part 362. That is, as viewed in the above-mentioned second cross section, the other-side top part 362 placed between two communication ports 364a adjacent to each other in the in-tube flow direction Df is placed with a deviation to one side in the n-tube flow direction Df between the two adjacent communication ports 364a.

In short, a first distance C1 in the in-tube flow direction Df shown in FIG. 8 is longer than a second distance C2. Here, a position of the crest of a one-side top part 361 or the other-side top part 362 placed between two communication ports 364a adjacent to each other in the in-tube flow direction Df will be taken as crest position Pf. The first distance C1 refers to a distance in the in-tube flow direction Df between the above-mentioned crest position Pf and the other communication port 364a of the two adjacent communication ports 364a provided on the other side in the in-tube flow direction Df relative to that crest position Pf. The second distance C2 refers to a distance in the in-tube flow direction Df between the above-mentioned crest position Pf and one communication port 364a of the two adjacent communication ports 364a provided on one side in the in-tube flow direction Df relative to that crest position Pf.

Figure 12:
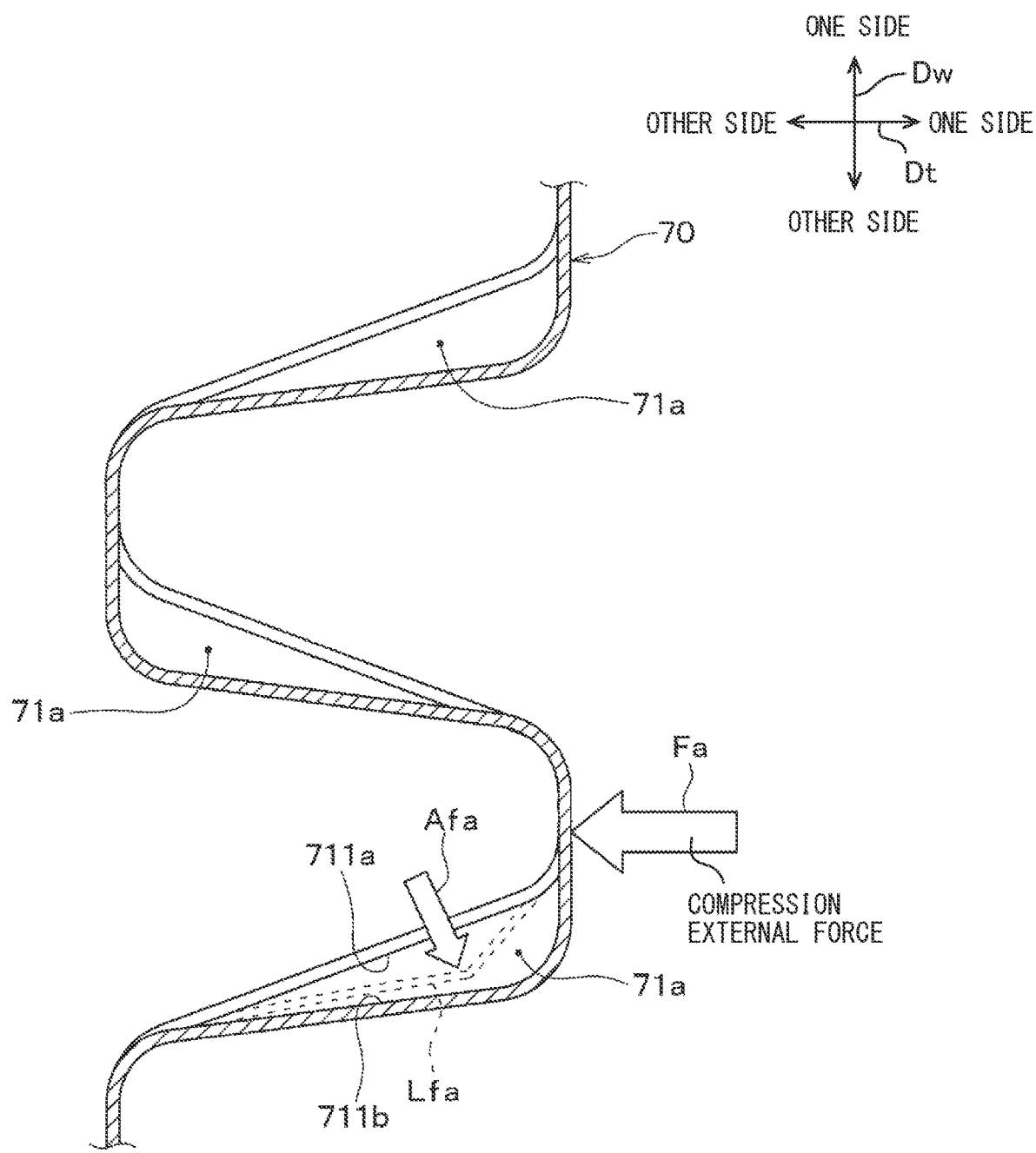
FIG. 12 is a sectional view schematically illustrating a cross section of a part of an inner fin as viewed in the same direction as in FIG. 10 in relation to a first comparative example.

For the comparison with the heat exchanger 1 in the present embodiment, a heat exchanger will be taken as a first comparative example in the following description. In the first comparative example, as shown in FIG. 12, an opening shape of a communication port 71a is in a shape of a triangle pointed to one side or the other-side in the flat thickness direction Dt as viewed in the above-mentioned first section. The communication port 71a in the first comparative example is equivalent to the communication port 364a in the present embodiment.

The communication port 71a in the first comparative example forms a triangular shape as mentioned above and of two sides 711a, 711b extended in the flat thickness direction Dt, one side 711a is different from the other side 711b in length. The heat exchanger in the first comparative example is significantly different from the heat exchanger 1 in the present embodiment in this regard.

It will be assumed that in the heat exchanger in the first comparative example, compression external force Fa is exerted on a flow path tube housing an inner fin 70 with a communication port 71a formed therein in the flat thickness direction Dt and as a result, a part of the inner fin 70 is buckled around the communication port 71a as shown in FIG. 12, for example. In this case, the periphery of the communication port 71a is being so deformed as to reduce a difference in length between a longer-side part equivalent to the longer side 711a of one side 711a and the other side 711b and a shorter-side part equivalent to the shorter side 711b. For this reason, in the periphery of the communication port 71a, the longer-side part equivalent to the longer side 711a is buckled ahead of the shorter-side part equivalent to the shorter side 711b as indicated by the broken line Lfa and the arrow Afa.

That is, in the heat exchanger in the first comparative example, when the longer-side part and the shorter-side part are buckled by compression external force Fa in the periphery of the communication port 71a, the longer-side part and the shorter-side part differ from each other in the timing of buckling. This is caused by a difference in length between one side 711a and the other side 711b around the communication port 71a. Therefore, that the one side 711a is different from the other side 711b in length is suspected to be one cause of degradation in strength of the inner fin 70.

According to the present embodiment, meanwhile, as shown in FIG. 8 and FIG. 10, in the first inner fin 34, the periphery 364b of a communication port 364a includes an edge 365a of a one-side wall part 365 and an edge 366a of the other-side wall part 366. The edge 365a of the one-side wall part 365 is formed such that the edge 366a of the other-side wall part 366 is shifted in parallel in the flat longitudinal direction Dw.

Therefore, the communication port 364a is so formed that the edge 365a of the one-side wall part 365 and the edge 366a of the other-side wall part 366 are identical or substantially identical with each other in length. For the reason, when the edge 365a of the one-side wall part 365 and the edge 366a of the other-side wall part 366 are buckled by compression external force Fa exerted on the flow path tube 3 in the flat thickness direction Dt (refer to FIG. 12), the edges are matched with each other in the timing of buckling. Consequently, degradation in strength of the first inner fin 34 due to provision of the communication parts 364 can be suppressed without necessity for making finer the fine flow paths 30a in the flow path tube 3 as compared with the above-mentioned heat exchanger in the first comparative example.

When degradation in strength of the first inner fin 34 is suppressed as mentioned above, the flow path tube 3 can be accordingly pressed hard against an electronic component 2 and heat resistance between the flow path tube 3 and the electronic components 2 can be reduced.

In the first inner fin 34 in the present embodiment, a plurality of communication ports 364a are formed. Therefore, the performance of heat transfer between the first inner fin 34 and the heating medium can be enhanced as compared with cases where the communication port 364a is not provided. Further, stagnation in a heating medium flow can be improved in the fine flow paths 30a.

Figure 13:
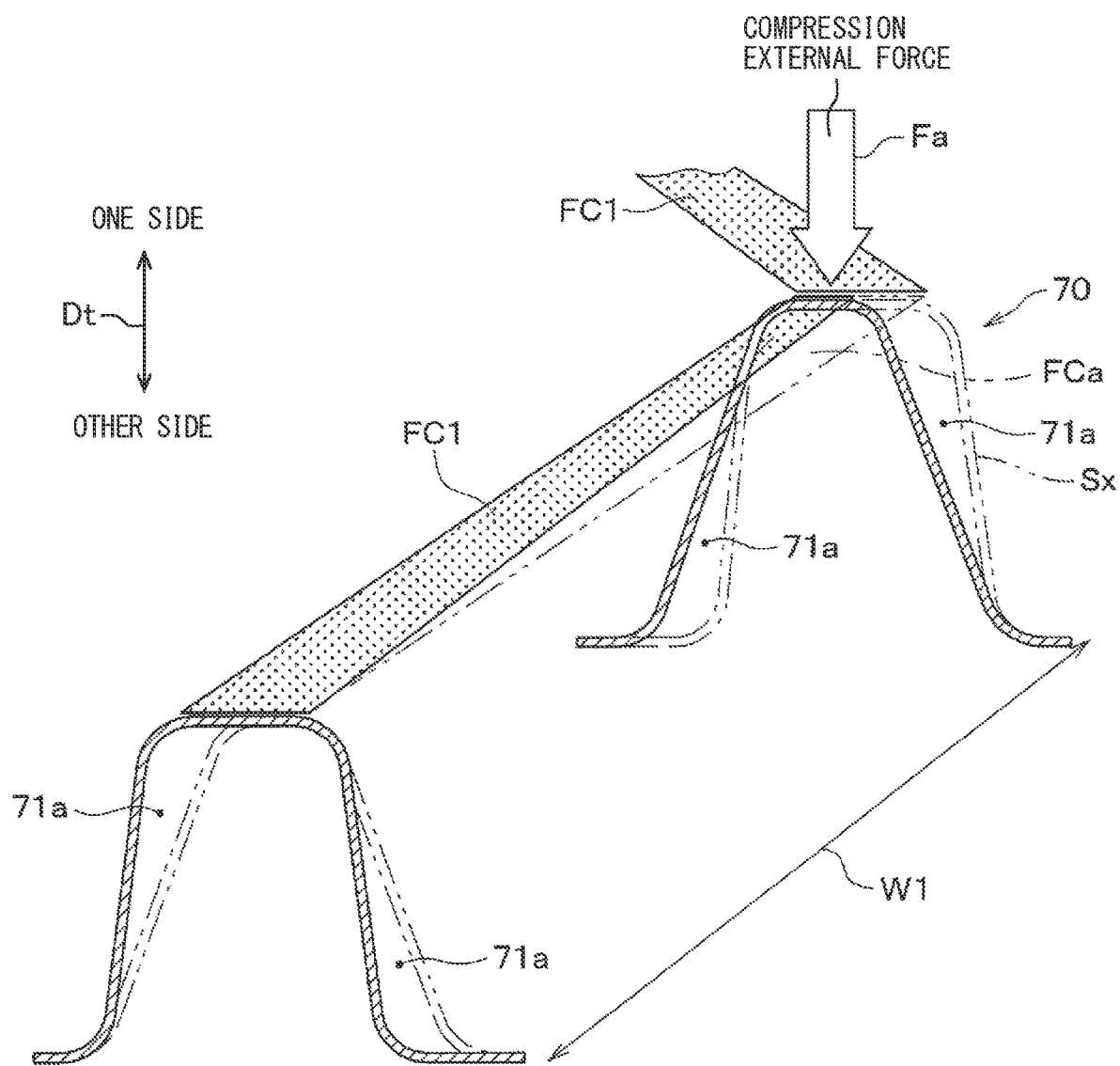
FIG. 13 is a perspective view of a part of an inner fin in the first comparative example, schematically showing an area of a pressure receiving surface receiving compression external force between two communication ports adjacent to each other in the direction of in-tube flow in the inner fin.

To explain the first comparative example again, here, it is assumed that in the first comparative example, compression external force Fa is exerted on an inner fin 70 in the flat thickness direction Dt as shown in FIG. 13. In this case, the compression external force Fa is received by a pressure receiving surface FC1 facing to an opposite direction to the compression external force Fa between an area W1 between two communication ports 71a adjacent to each other in the in-tube flow direction Df. Since in the first comparative example, the communication ports 71a are formed in a triangular shape as mentioned above, in the pressure receiving surface FC1, one side in the in-tube flow direction Df is narrower than the opposite side. For this reason, a pressure receiving area that is an area of the pressure receiving surface FC1 is reduced by an amount equivalent to an area of the alternate long and two short dashes line FCa in FIG. 13 as compared with, for example, cases without a communication port where the communication port 71a is not formed and a corrugated shape of the inner fin 70 is maintained in a cross section Sx. For this reason, it is supposed that in the first comparative example, the strength of the inner fin 70 resisting compression external force Fa is reduced.

According to the present embodiment, meanwhile, as shown in FIG. 8 and FIG. 10, in each of the communication parts 364, the edge 365a of a one-side wall part 365 is formed such that the edge 366a of the other-side wall part 366 is shifted in parallel in the flat longitudinal direction Dw. For this reason, the pressure receiving surface FC1 of the first inner fin 34 in the present embodiment is substantially identical in width both on one side and on the other side in the in-tube flow direction Df and substantially the same pressure receiving area as the above-mentioned cases without a communication port can be obtained. For example, in the present embodiment, a pressure receiving area obtained by adding the area of the pressure receiving surface FC1 of the first comparative example shown in FIG. 13 and the area of the alternate long and two short dashes line FCa can be obtained. Therefore, in the present embodiment, the strength of the first inner fin 34 resisting compression external force Fa (refer to FIG. 13) can be enhanced as compared with the first comparative example.

To simply increase the strength of the first inner fin 34, a plate thickness of the first inner fin 34 could be increased or a number of pitches of the corrugated cross sectional shape shown in FIG. 3 could be increased but these measures bring about significant demerits. For example, when a plate thickness of the first inner fin 34 is increased, a demerit of increase in a pressure drop in the heating medium flowing through the fine flow paths 30a is caused by reduction in the flow path cross-sectional area of each of the fine flow paths 30a. A demerit of degradation in machinability of the first inner fin 34 is also brought about.

Also, when a number of pitches of the corrugated cross sectional shape in the first inner fin 34 is increased, a demerit of increase in pressure drop in the heating medium flowing through the fine flow paths 30a is brought about. Increase in a number of pitches of the corrugated cross sectional shape is subjected to dimensional limitations from the beginning.

According to the present embodiment, the first inner fin 34 is configured as an offset fin having a predetermined offset shape as shown in FIG. 10 and FIG. 11. The offset shape is a shape obtained by shifting in parallel the first protruded portion 371 to the other side in the flat longitudinal direction Dw relative to the second protruded portion 372 so that the communication port 364a is increased in width in the flat longitudinal direction Dw. This offset shape will be designated as positive-direction offset shape. In the first inner fin 34 in this positive-direction offset shape, the edge 365a of the one-side wall part 365 is placed on the other side of the edge 366a of the Six other-side wall part 366 in the flat longitudinal direction Dw in each of the communication parts 364.

Therefore, in the first inner fin 34 in the positive-direction offset shape, a pressure drop created in the heating medium flowing through the fine flow paths 30a can be reduced as compared with an inner fin formed in a negative-direction offset shape offset in the opposite direction to the positive-direction offset shape.

Figure 14:
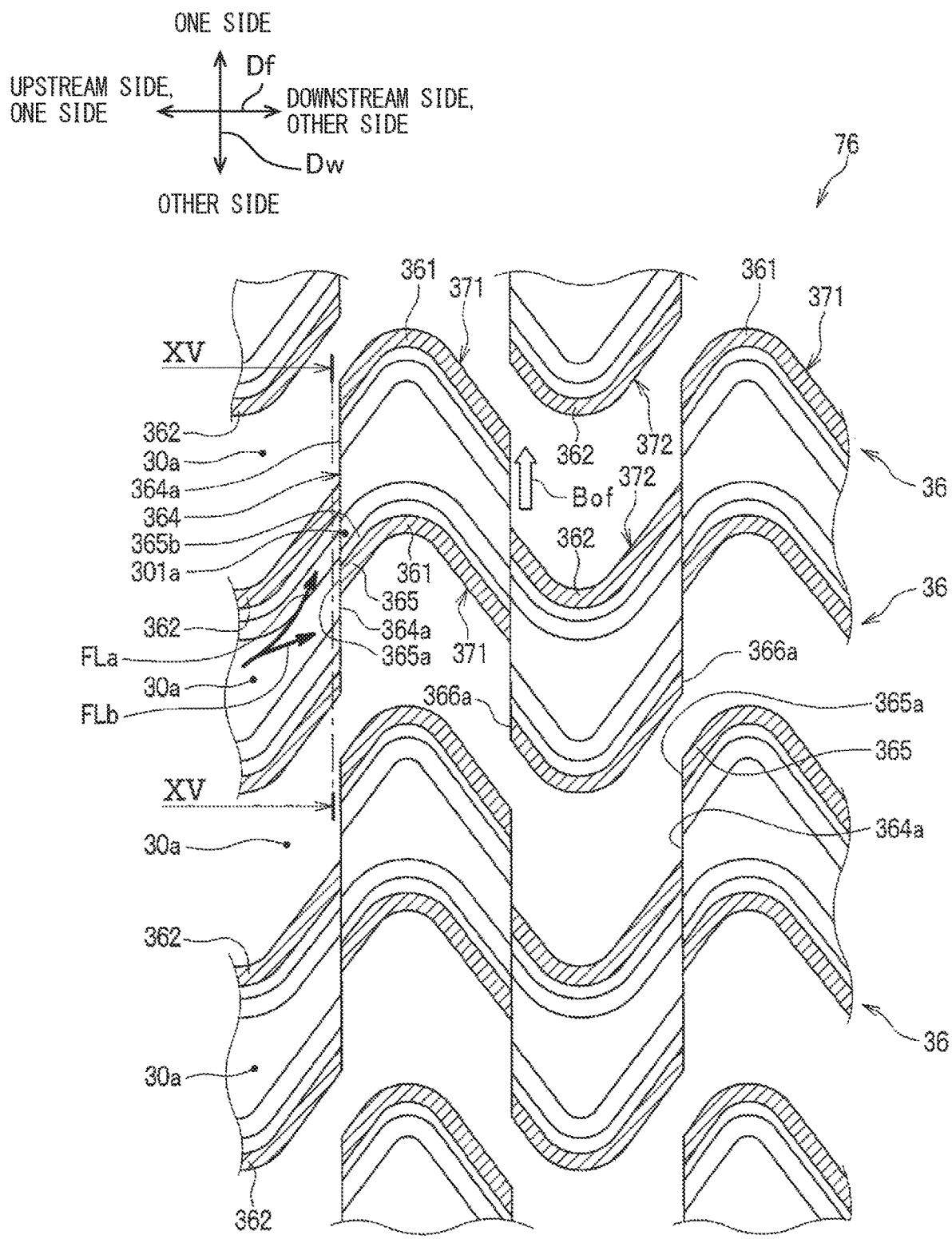
FIG. 14 is an enlarged sectional view illustrating a part of an inner fin in a second comparative example in an enlarged manner, equivalent to FIG. 8.
Figure 15:
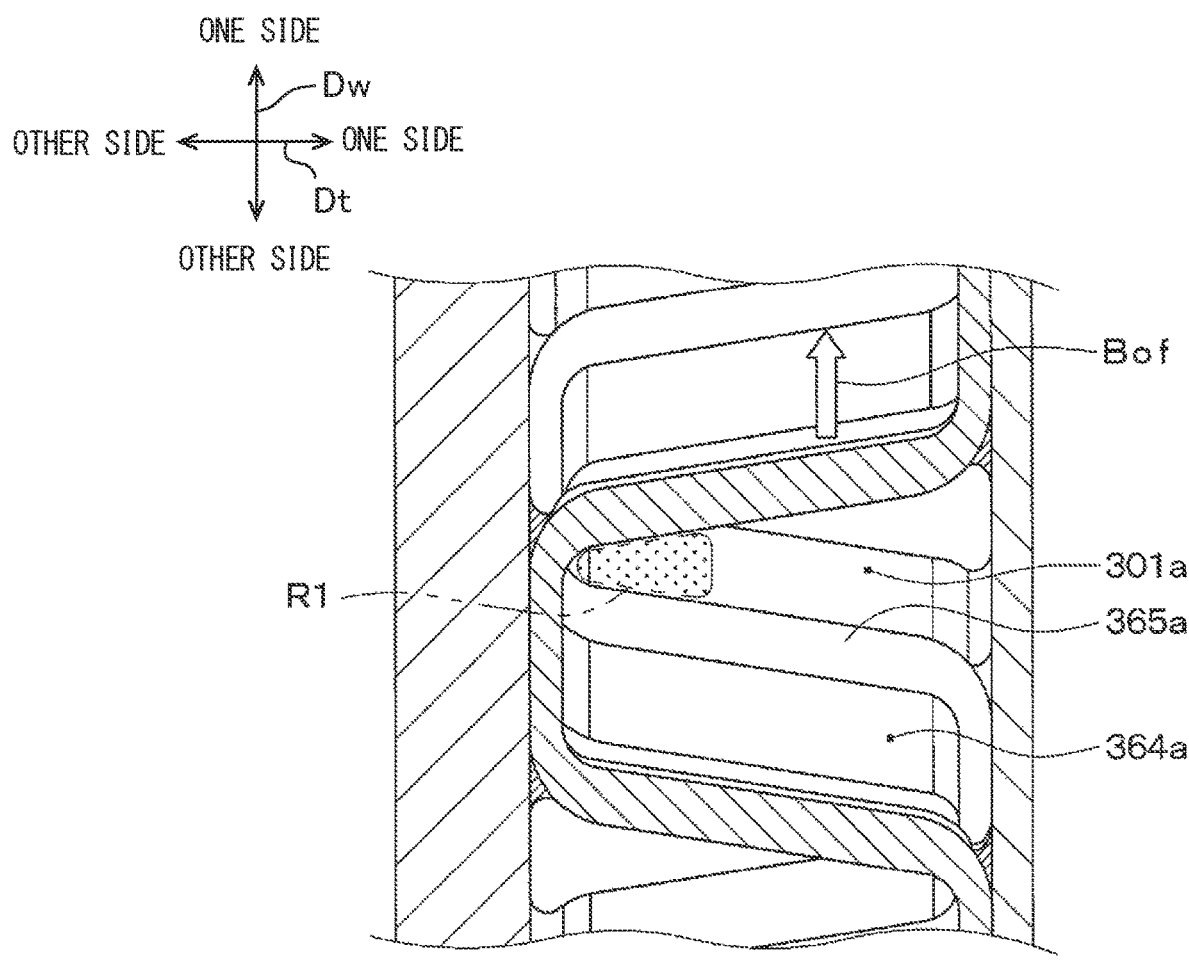
FIG. 15 is a sectional view of a cross section taken along line XV-XV of FIG. 14 in relation to the second comparative example, equivalent to FIG. 10.

To explain this working-effect, a description will be given to a second comparative example shown in FIG. 14 and FIG. 15. In the second comparative example, an inner fin 76 is configured as an offset fin having a negative-direction offset shape as shown in FIG. 14 and FIG. 15. The negative-direction offset shape is a shape obtained by shifting in parallel a first protruded portion 371 to one side in the flat longitudinal direction Dw relative to a second protruded portion 372 so that a communication port 364a is increased in width in the flat longitudinal direction Dw. In short, the negative-direction offset shape is a shape obtained by shifting in parallel the first protruded portion 371 relative to the second protruded portion 372 from a state without the communication port 364a as indicated by the arrow Bof.

In the second comparative example, a heating medium flow in a fine flow path 30a is bifurcated by an edge 365a, 366a of a one-side wall part 365 or the other-side wall part 366 opposed to the heating medium flow in a position where the communication port 364a is provided as indicated by the arrows FLa, FLb in FIG. 14. This is also the same with the present embodiment as shown in FIG. 8. The arrows FLa, FLb in FIG. 8 and FIG. 14 specifically indicate a heating medium flow bifurcated by the edge 365a of the one-side wall part 365.

In the second comparative example, when a heating medium flow is bifurcated as mentioned above, immediately after the bifurcation, one heating medium flow shown by the arrow Fla in FIG. 14 is slanted in the in-tube flow direction Df and collides with an opposite wall surface 365b facing upstream of the heating medium flow. At this time, the one heating medium flow does not pass through a communication port 364a but passes through an adjacent port 301a adjacent to the communication port 364a and then collides with the opposite wall surface 365b. Though the opposite wall surface 365b may be a wall surface of the other-side wall part 366 depending on a location thereof, in this description, it is assumed that the opposite wall surface is a wall surface of a one-side wall part 365.

The adjacent port 301a forms a shape different in width (that is, the width in the flat longitudinal direction Dw) according to a location thereof in the flat thickness direction Dt. For example, the adjacent port 301a shown in FIG. 15 is in such a shape that a breadth thereof is smaller than others' in a narrow area R1 of the adjacent port 301a positioned with a deviation to the other side in the flat thickness direction Dt. For this reason, a heating medium flow passes through a narrow area R1 of the adjacent port 301a collides hard with the opposite wall surface 365b in proximity to the narrow area R1. This is also the same with other spots than shown in FIG. 15. As a result, in the second comparative example, a pressure drop created in the heating medium flowing through the fine flow paths 30a is increased.

In the present embodiment, meanwhile, when a heating medium flow is bifurcated, immediately after the bifurcation, one heating medium flow indicated by the arrow Fla in FIG. 8 collides with an opposite wall surface 365b. Though this itself is the same as the second comparative example, in the present embodiment, the one heating medium flow does not pass through an adjacent port 301a but passes through a communication port 364a and then collides with the opposite wall surface 365b. The communication port 364a is in such a shape that the breadth is uniform as indicated by the arrow Wa (refer to FIG. 10) regardless of a location thereof in the flat thickness direction Dt. For this reason, a heating medium flow colliding with the opposite wall surface 365b in the present embodiment does not collide with the opposite wall surface 365b so hard as a heating medium flow in the second comparative example. This is also the same with other spots than shown in FIG. 10. Therefore, in the present embodiment, a pressure drop created in the heating medium flowing through the fine flow paths 30a can be reduced as compared with the second comparative example.

In the present embodiment, the other heating medium flow indicated by the arrow FLb in FIG. 8 passes through an adjacent port 301a but immediately after the passage, neither an opposite wall surface 365b with which the other heating medium flow collides nor a wall surface equivalent thereto is present. Therefore, even though the other heating medium flow does not pass through the adjacent port 301a but passes through the communication port 364a, a pressure drop in the heating medium caused by the passage of the other heating medium flow through the adjacent port 301a does not differ so much. That is, whichever a passage opening on the side without the opposite wall surface 365b or a wall surface equivalent thereto with which a heating medium flow collides is, the adjacent port 301a or the communication port 364a as a passage opening through which the heating medium flow passes, that hardly produce any difference in influence on a pressure drop in the heating medium.

According to the present embodiment, as shown in FIG. 8 and FIG. 9, a communication port 364a of the first inner fin 34 is placed in an intermediate part 363 away from a one-side top part 361 and the other-side top part 362. Therefore, the strength of the first inner fin 34 resisting compression external force Fa in the flat thickness direction Dt (refer to FIG. 16) can be enhanced as compared with cases where the communication port 364a is placed in the one-side top part 361 or the other-side top part 362.

Figure 16:
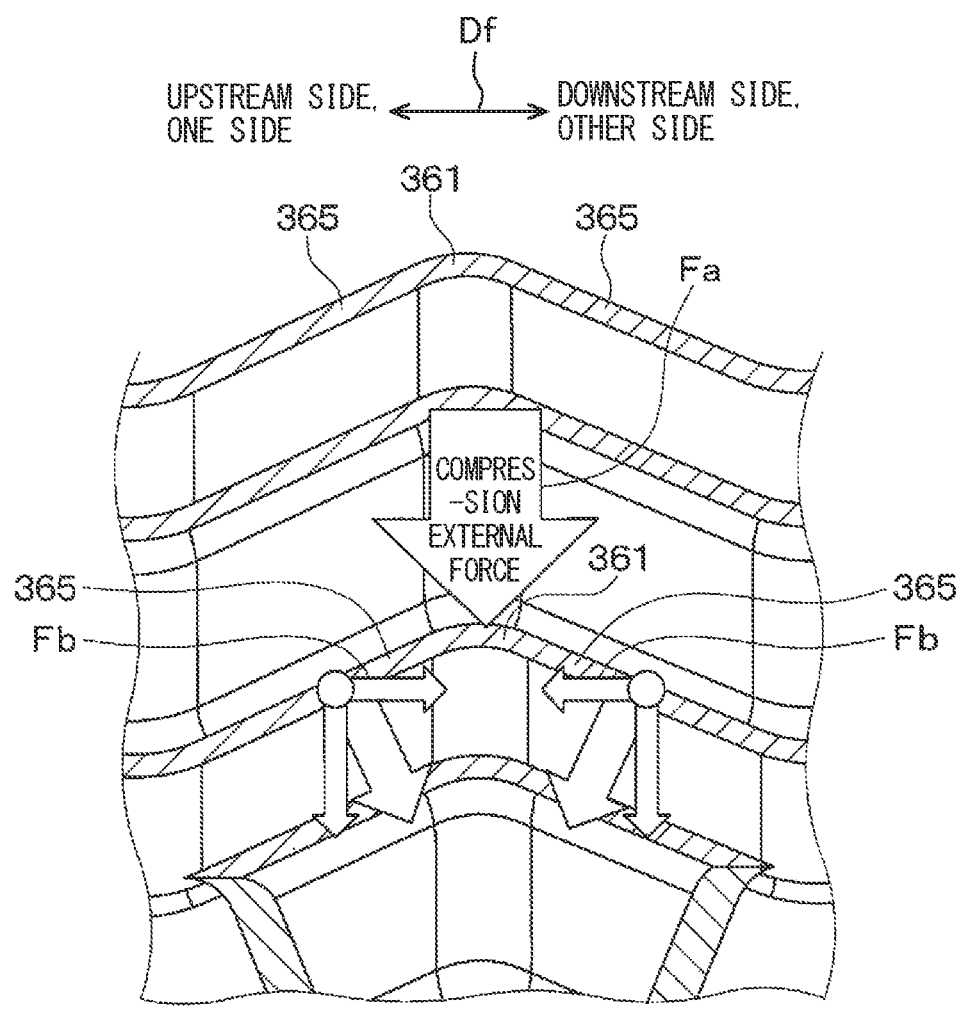
FIG. 16 is a perspective view illustrating a cross section of a part of a first inner fin in the first embodiment, showing how compression external force is exerted on a flow path tube housing the first inner fin in the flat thickness direction.

To explain the foregoing, it is assumed that compression external force Fa is exerted on a flow path tube 3 housing a first inner fin 34 in the flat thickness direction Dt as shown in FIG. 16, for example. In this case, a pair of one-side wall parts 365 placed with a one-side top part 361 in between are respectively slanted in the flat thickness direction Dt; therefore, compression external force Fa is exerted on the one-side wall parts 365 also so as to topple the one-side wall parts 365.

That is, at the one-side wall parts 365, the compression external force Fa has a component of force Fb pointing to the in-tube flow direction Df. This component of force Fb becomes components of force respectively pointing to opposite directions at a pair of the above-mentioned one-side wall parts 365. In the present embodiment, the communication port 364a is placed away from a one-side top part 361 as mentioned above and at the one-side top part 361, a pair of the above-mentioned one-side wall parts 365 connect to each other; therefore, the components of force Fb respectively pointing to opposite directions cancel out each other.

That is, a pair of the one-side wall parts 365 with the one-side top part 361 in between are so structured as to support each other to resist compression external force Fa. Since the communication port 364a is placed also away from the other-side top part 362, the foregoing also applies to a pair of the other-side wall parts 366 placed with the other-side top part 362 in between. As mentioned above, therefore, the strength of the first inner fin 34 resisting compression external force Fa in the flat thickness direction Dt can be enhanced as compared with cases where the communication port 364a is placed at the one-side top part 361 or the other-side top part 362.

According to the present embodiment, as viewed in the above-mentioned first cross section shown in FIG. 3, one of two fine flow paths 30a adjacent to each other in the flat longitudinal direction Dw has a cross sectional shape of a trapezoid in which the fine flow path is larger in width on the other side in the flat thickness direction Dt than on one side in the flat thickness direction Dt. The other of the two adjacent fine flow paths 30a has a cross sectional shape of a trapezoid in which the fine flow path is larger in width on one side in the flat thickness direction Dt than on the other side in the flat thickness direction Dt. Therefore, a sidewall surface facing to the fine flow path 30a in the flat longitudinal direction Dw is a slanted surface slanted in the flat thickness direction Dt.

For this reason, the working-effect of agitating the heating medium flowing through a fine flow path 30a in the flat thickness direction Dt can be enhanced, for example, as compared with cases where the above-mentioned sidewall surface facing to the fine flow path 30a is parallel with the flat thickness direction Dt.

According to the present embodiment, as viewed in the above-mentioned second cross section shown in FIG. 8, a one-side top part 361 placed between two communication ports 364a adjacent to each other in the in-tube flow direction Df is placed with a deviation to one side in the in-tube flow direction Df between the two adjacent communication ports 364a.

Of a pair of one-side wall parts 365 placed with a one-side top part 361 in between, the downstream one-side wall part 365 extended from the one-side top part 361 to the other side in the in-tube flow direction Df has a deflecting function and deflects a heating medium flow that has passed through a communication port 364a or an adjacent port 301a. Meanwhile, of a pair of the one-side wall parts 365, the upstream one-side wall part 365 extended from the one-side top part 361 to one side in the in-tube flow direction Df does not have the deflecting function. The upstream one-side wall part 365 only has to have a length sufficient to distribute a heating medium flow to the communication port 364a and the adjacent port 301a.

In the present embodiment, as mentioned above, a one-side top part 361 is placed with a deviation to one side in the in-tube flow direction Df between two communication ports 364a adjacent to each other in the flat longitudinal direction Dw; therefore, the downstream one-side wall part 365 having the deflecting function can be formed long. Consequently, the deflecting function is enhanced and thus meandering of the heating medium flowing through the fine flow paths 30a is facilitated and the performance of heat exchange between the electronic components 2 and the heating medium can be enhanced.

As viewed in the above-mentioned second cross section shown in FIG. 8, the other-side top part 362 placed between two communication ports 364a adjacent to each other in the in-tube flow direction Df is also placed with a deviation to one side in the in-tube flow direction Df between the two adjacent communication ports 364a. Therefore, like the foregoing, the above-mentioned deflecting function is enhanced also around the other-side top parts 362 of the first inner fin 34. Consequently, meandering of the heating medium flowing through the fine flow paths 30a is facilitated and the performance of heat exchange between the electronic components 2 and the heating medium can be enhanced.

According to the present embodiment, as shown in FIG. 8, one of an edge 365a of a one-side wall part 365 and an edge 366a of the other-side wall part 366 embraced in the periphery 364b of a communication port 364a is the leading edge of a wall part opposed to a heating medium flow in a fine flow path 30a. The leading edge turns out to be placed in a region involving a fast heating medium flow in the fine flow path 30a. Therefore, a leading edge effect can be enhanced and the performance of heat exchange between the first inner fin 34 and the heating medium is enhanced at the leading edge of the wall part.

Second Embodiment

A description will be given to the second embodiment. In relation to the present embodiment, a description will be given mainly to a difference from the first embodiment. A description of an element identical with or equivalent to those in the above-mentioned embodiment will be omitted or simplified. This applies also to descriptions of the following embodiments.

Figure 17:
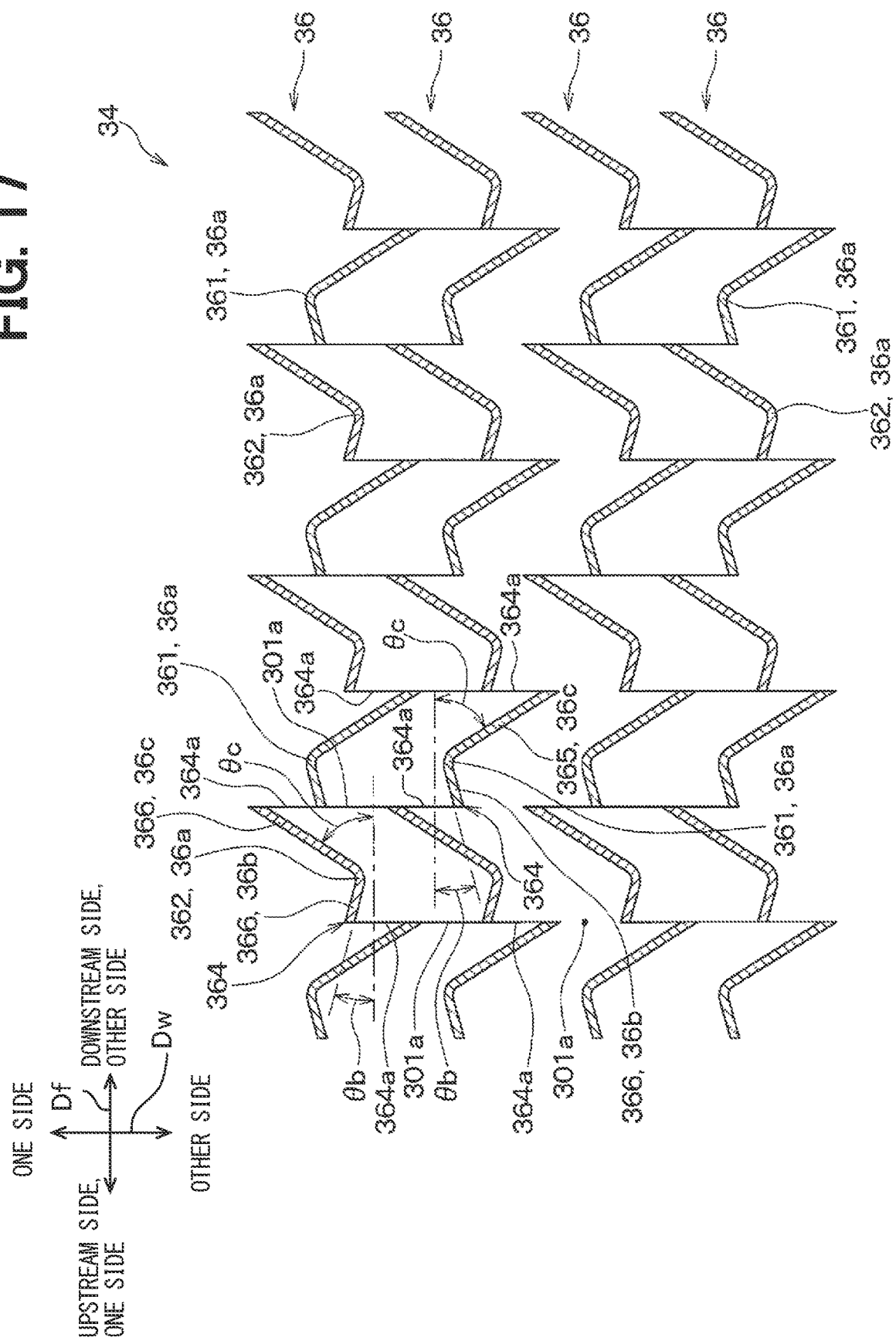
FIG. 17 is a sectional view illustrating a part of a first inner fin in a second embodiment as viewed in the second cross section in an excerpted manner.

In the present embodiment, as shown in FIG. 17, a pair of one-side wall parts 365 placed with a one-side top part 361 in between are different from each other in angle to the in-tube flow direction Df. A pair of the other-side wall parts 366 placed with the other-side top part 362 in between are different from each other in angle to the in-tube flow direction Df. The present embodiment is different from the first embodiment in this regard.

In the description of the present embodiment, of a plurality of one-side top parts 361 and a plurality of the other-side top parts 362, a one-side top part 361 and the other-side top part 362 adjacent to a communication part 364 on the other side in the in-tube flow direction Df will be designated as sidewall top part 36a. The first inner fin 34 includes a pair of extended wall parts 36b, 36c extended from a sidewall top part 36a and placed with the sidewall top part 36a in between and a pair of the extended wall parts 36b, 36c separate two fine flow paths 30a adjacent to each other in the flat longitudinal direction Dw from each other.

A pair of the extended wall parts 36b, 36c are equivalent to a pair of one-side wall parts 365 placed with a one-side top part 361 as a sidewall top part 36a in between and a pair of the other-side wall parts 366 placed with the other-side top part 362 as a sidewall top part 36a in between. Therefore, one extended wall part 36b of a pair of the extended wall parts 36b, 36c is extended from the sidewall top part 36a to one side in the in-tube flow direction Df. The other extended wall part 36c of a pair of the extended wall parts 36b, 36c is extended from the sidewall top part 36a to the other side in the in-tube flow direction Df.

As viewed in the above-mentioned second cross section shown in FIG. 17, the other-side elevation angle θc, which is an elevation angle θc formed by the other extended wall part 36c to the in-tube flow direction Df, is larger than a one-side elevation angle θb, which is an elevation angle θb formed by the one extended wall part 36b to the in-tube flow direction Df. The one-side elevation angle θb refers to the smaller angle of two angles formed by the one extended wall part 36b to the in-tube flow direction Df. The other-side elevation angle θc refers to the smaller angle of two angles formed by the other extended wall part 36c to the in-tube flow direction Df.

When the other extended wall part 36c is equivalent to, for example, the one-side wall part 365 of the one-side wall part 365 and the other-side wall part 366, in detail, the other extended wall part 36c is equivalent to the above-mentioned downstream one-side wall part 365. Therefore, the other extended wall part 36c has the above-mentioned deflecting function and deflects a heating medium flow that has passed through a communication port 364a or an adjacent port 301a.

In the present embodiment, as mentioned above, a one-side elevation angle θb and the other-side elevation angle θc are in a relation of "θc>θb"; therefore, the deflecting function can be enhanced as compared with cases where the elevation angles are conversely in a relation of "θc<θb." Consequently, meandering of the heating medium flowing through the fine flow paths 30a is facilitated and the performance of heat exchange between the electronic components 2 and the heating medium can be enhanced. In the first embodiment, as seen from FIG. 8, a one-side elevation angle θb and the other-side elevation angle θc are equal to each other.

The present embodiment is identical with the first embodiment except the foregoing. In the present embodiment, an effect brought about by configuration elements common to those of the first embodiment is brought about as in the first embodiment.

Third Embodiment

A description will be given to the third embodiment. In relation to the present embodiment, a description will be given mainly to a difference from the first embodiment.

Figure 18:
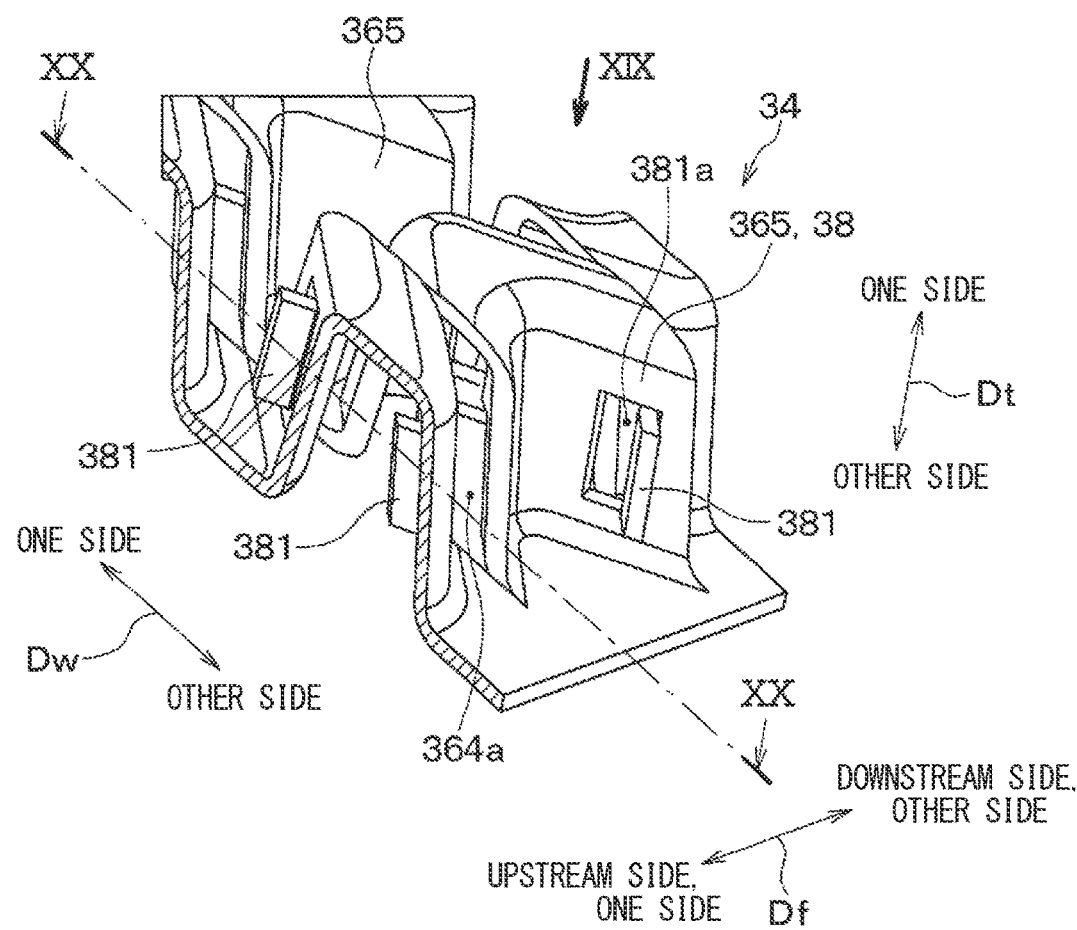
FIG. 18 is a perspective view illustrating a part of a first inner fin in a third embodiment in an excerpted manner.
Figure 19:
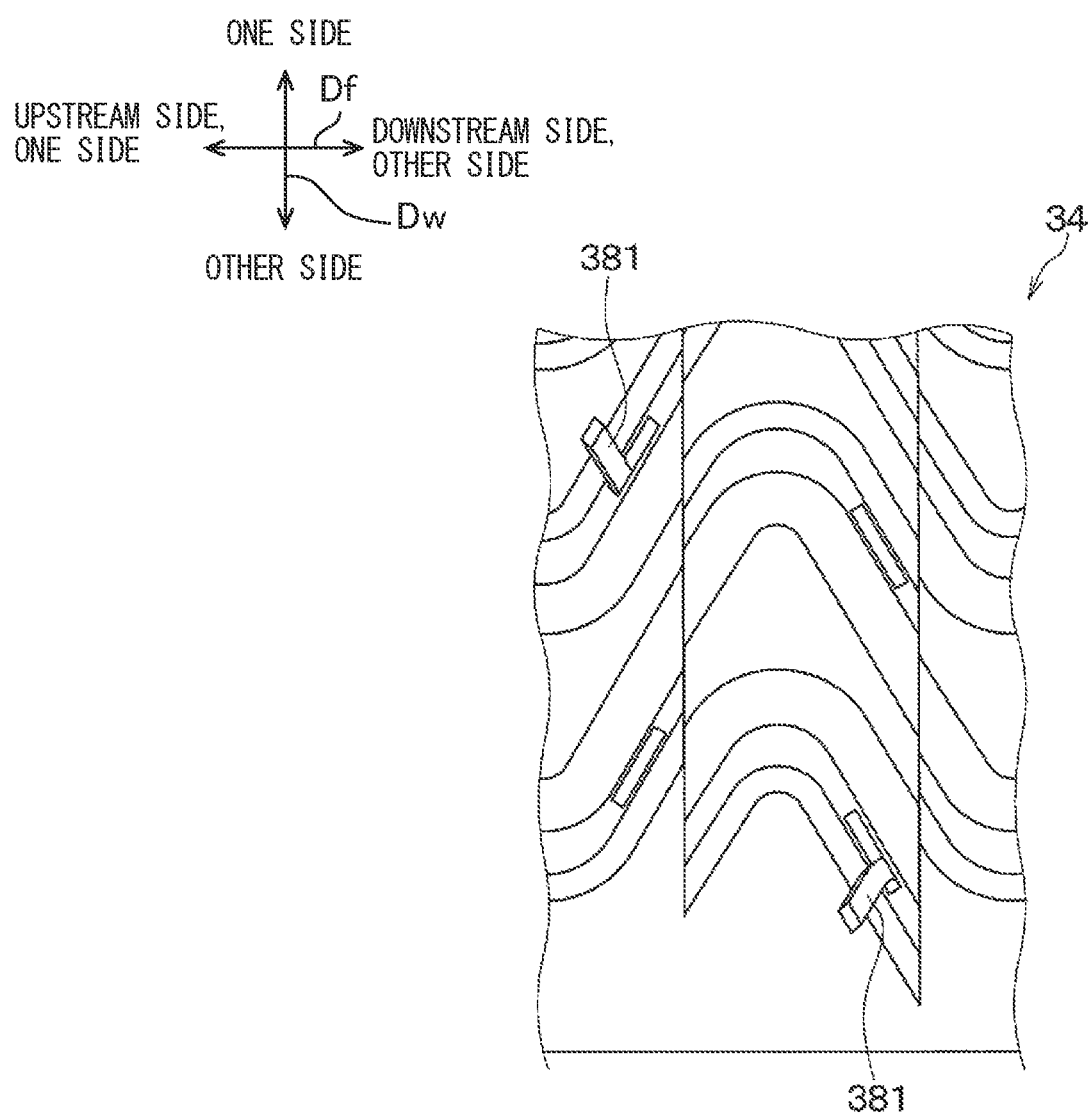
FIG. 19 is a drawing as viewed in the direction of the arrow XIX in FIG. 18.
Figure 20:
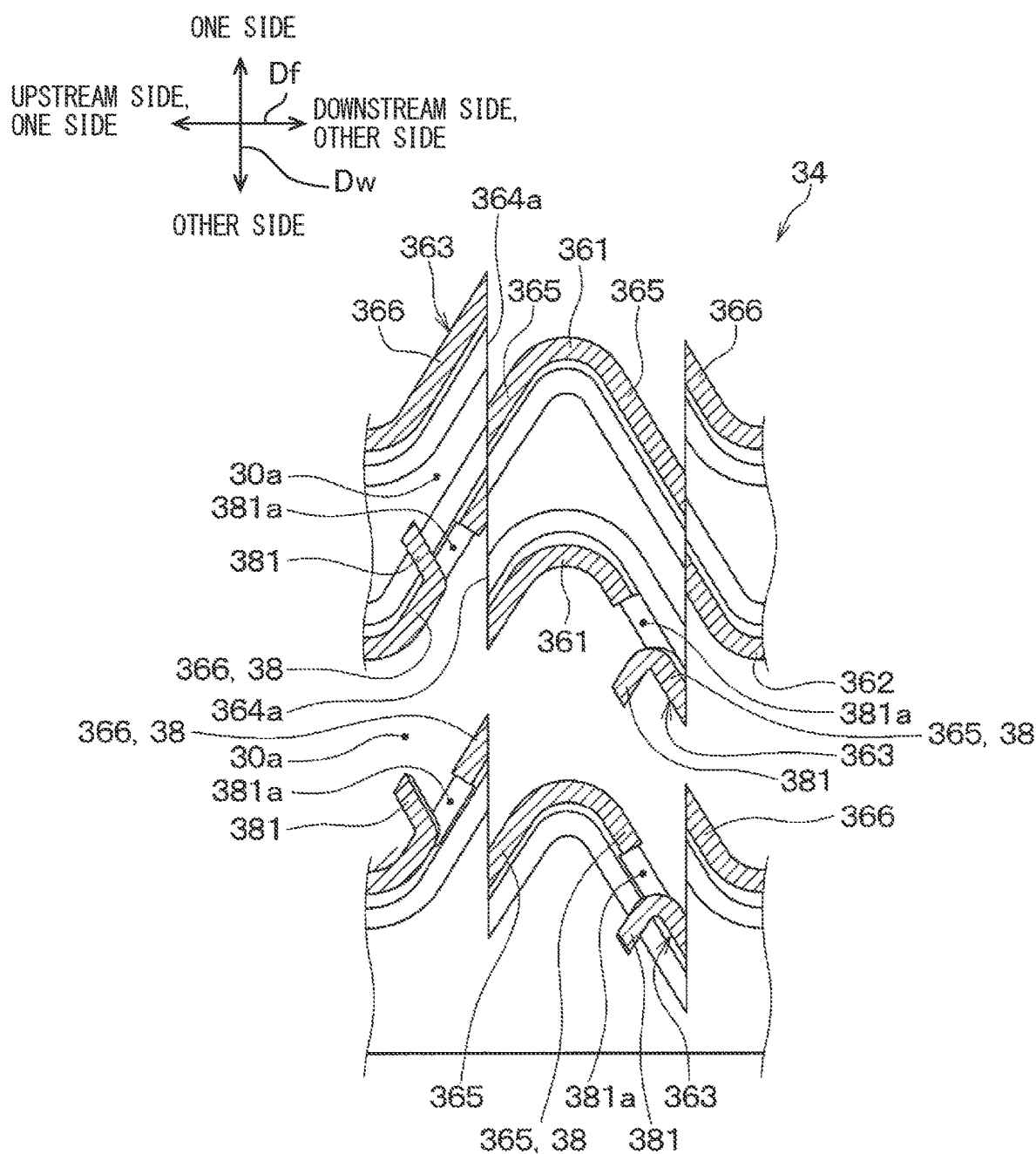
FIG. 20 is a sectional view of a cross section taken along line XX-XX of FIG. 18.

As shown in FIG. 18 to FIG. 20, any or all of a plurality of intermediate parts 363 includes a cut and raised wall part 38 having the cut and raised part 381 and the cut and raised wall part 38 is provided as a one-side wall part 365 or the other-side wall part 366. In other words, any or all of a plurality of one-side wall parts 365 and a plurality of the other-side wall parts 366 include the cut and raised part 381. In the present embodiment, some of the one-side wall parts 365 and some of the other-side wall parts 366 respectively include the cut and raised part 381. The present embodiment is different from the first embodiment in this regard.

Specifically, the cut and raised part 381 is in a shape of a louver and is protruded to a fine flow path 30a. The cut and raised part 381 is in a cut and raised shape so that a through hole 381a penetrating the cut and raised wall part 38 is formed on one side or the other side in the in-tube flow direction Df relative to the cut and raised part 381. That is, the cut and raised part 381 is placed on one side or the other side in the in-tube flow direction Df relative to a through hole 381a formed by the cut and raised part 381 being cut and raised. In the present embodiment, in some of the cut and raised parts 381, a through hole 381a is formed on one side in the in-tube flow direction Df relative to the cut and raised parts 381 and in some of the cut and raised parts, a through hole 381a is formed on the other side in the in-tube flow direction Df relative to the cut and raised parts 381.

The cut and raised parts 381 and the through holes 381a are extended in the flat thickness direction Dt. Therefore, the tip and the base end of each cut and raised part 381 are both extended in the flat thickness direction Dt.

According to the present embodiment, as mentioned above, the cut and raised part 381 is formed in the first inner fin 34 which is cut and raised so that a through hole 381a is formed in the cut and raised wall part 38. Therefore, the heating medium flows also through a through hole 381a in the cut and raised wall part 38 between fine flow paths 30*a* adjacent to each other in the flat longitudinal direction Dw and as a result, heat transfer between the heating medium and the first inner fin 34 is facilitated. Consequently, the performance of heat exchange between the electronic components 2 and the heating medium can be enhanced.

According to the present embodiment, the cut and raised part 381 is cut and raised so that a through hole 381*a* is formed on one side or the other side in the in-tube flow direction Df relative to the cut and raised part 381. For this reason, the cut and raised part 381 also resists compression external force Fa exerted in the flat thickness direction Dt (refer to FIG. 12).

Therefore, the first inner fin 34 can be so formed that an intermediate part 363 having the cut and raised part 381 is less prone to buckle in the flat thickness direction Dt. As a result, degradation in the strength of the first inner fin 34 due to provision of a through hole 381*a* in an intermediate part 363 can be suppressed without necessity for making finer a plurality of fine flow paths 30*a* in a flow path tube 3.

The present embodiment is identical with the first embodiment except the foregoing. In the present embodiment, an effect brought about by configuration elements common to those of the first embodiment is brought about as in the first embodiment.

The present embodiment is a modification to the first embodiment but the present embodiment can also be combined with the second embodiment.

Fourth Embodiment

A description will be given to the fourth embodiment. In relation to the present embodiment, a description will be given mainly to a difference from the third embodiment.

Figure 21:
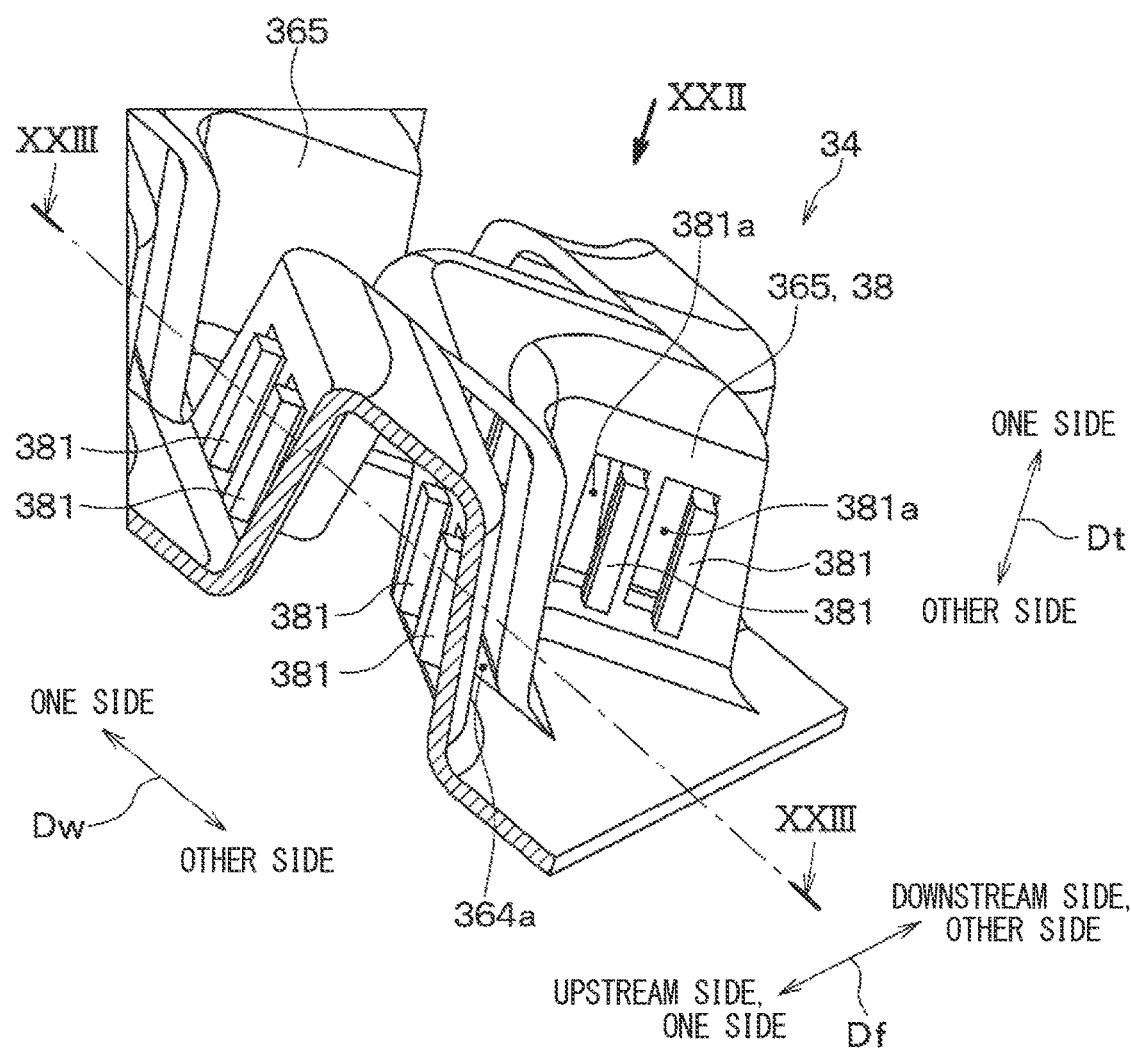
FIG. 21 is a perspective view illustrating a part of a first inner fin in a fourth embodiment in an excerpted manner, equivalent to FIG. 18.
Figure 22:
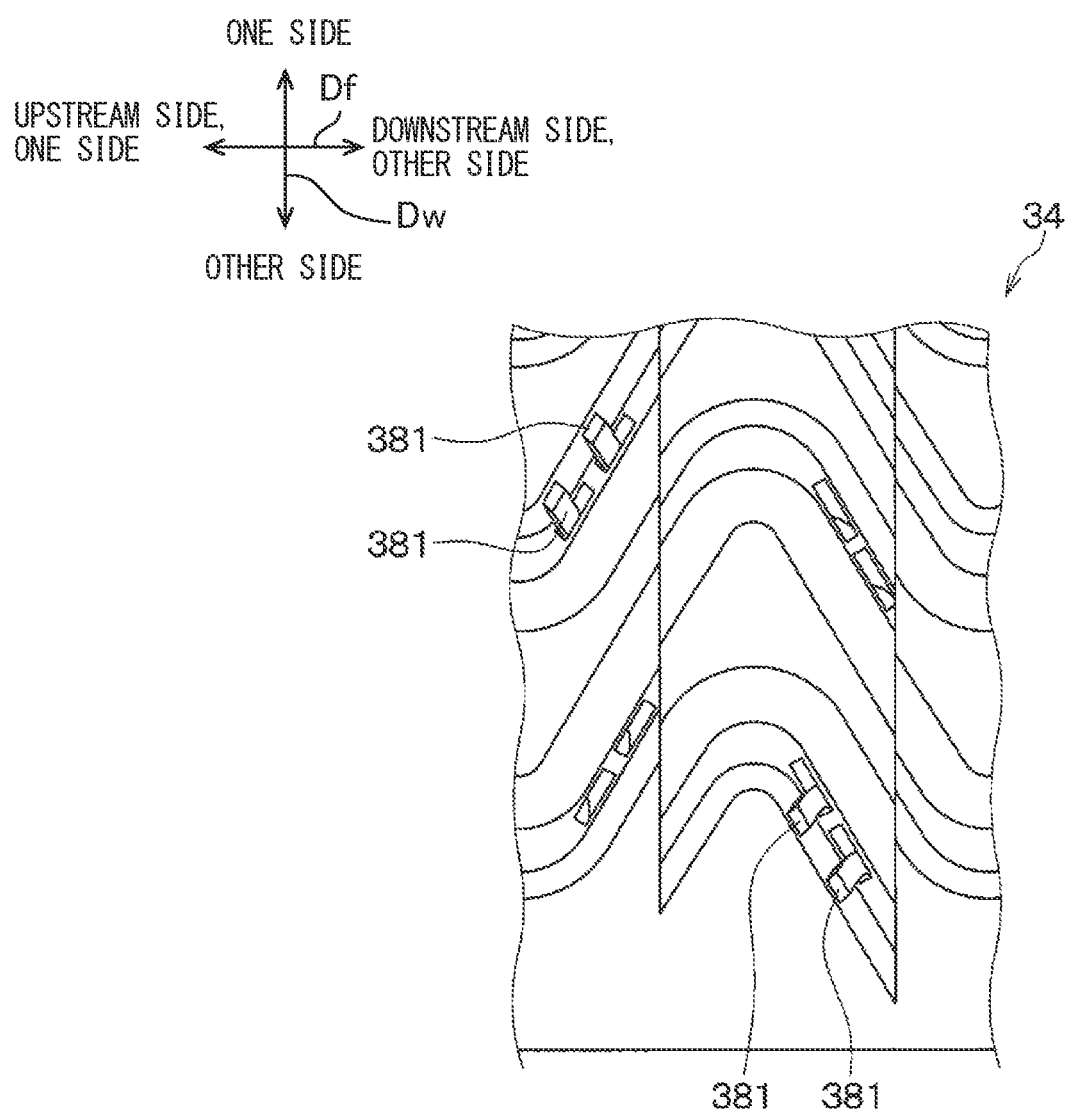
FIG. 22 is a drawing as viewed in the direction of the arrow XXII in FIG. 21, equivalent to FIG. 19.
Figure 23:
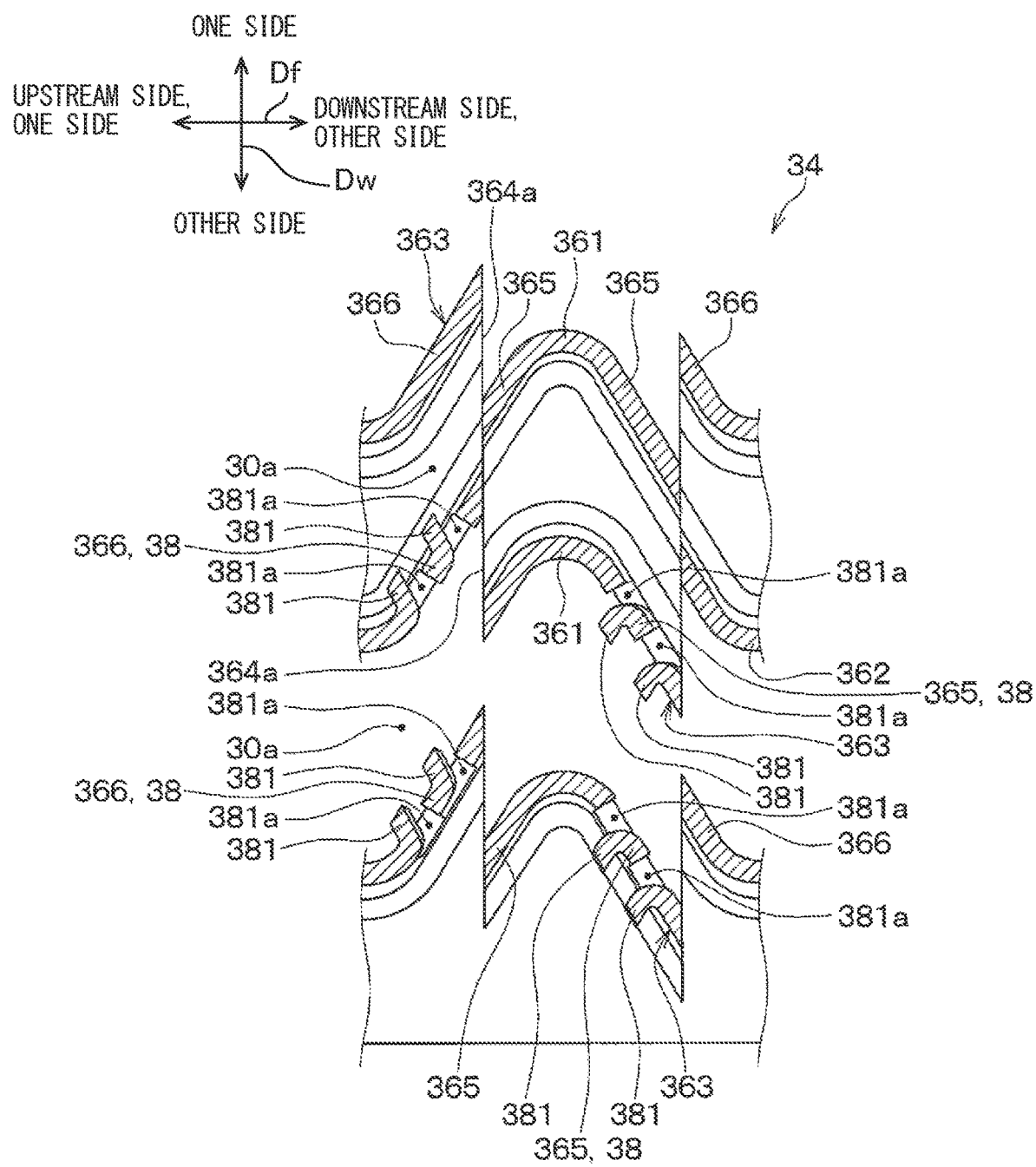
FIG. 23 is a sectional view of a cross section taken along line XXIII-XXIII of FIG. 21, equivalent to FIG. 20.

In the third embodiment, as shown in FIG. 20, one cut and raised part 381 and one through hole 381*a* are provided in each cut and raised wall part 38. In the present embodiment, meanwhile, as shown in FIG. 21 to FIG. 23, two cut and raised parts 381 and two through holes 381*a* are provided in each cut and raised wall part 38. In other words, in the present embodiment, a plurality of cut and raised parts 381 cut and raised so that a through hole 381*a* is formed in the cut and raised wall part 38 are provided in each of a plurality of cut and raised wall parts 38. The present embodiment is different from the third embodiment in this regard.

The present embodiment is identical with the third embodiment except the foregoing. In the present embodiment, an effect brought about by configuration elements common to those of the third embodiment is brought about as in the third embodiment.

Fifth Embodiment

A description will be given to the fifth embodiment. In relation to the present embodiment, a description will be given mainly to a difference from the first embodiment.

In the first embodiment, as shown in FIG. 8, the periphery 364*b* of a communication port 364*a* is so formed that a position of an edge 365*a* of a one-side wall part 365 embraced in the periphery 364*b* and a position of an edge 366*a* of the other-side wall part 366 are identical with each other in the in-tube flow direction Df.

Figure 24:
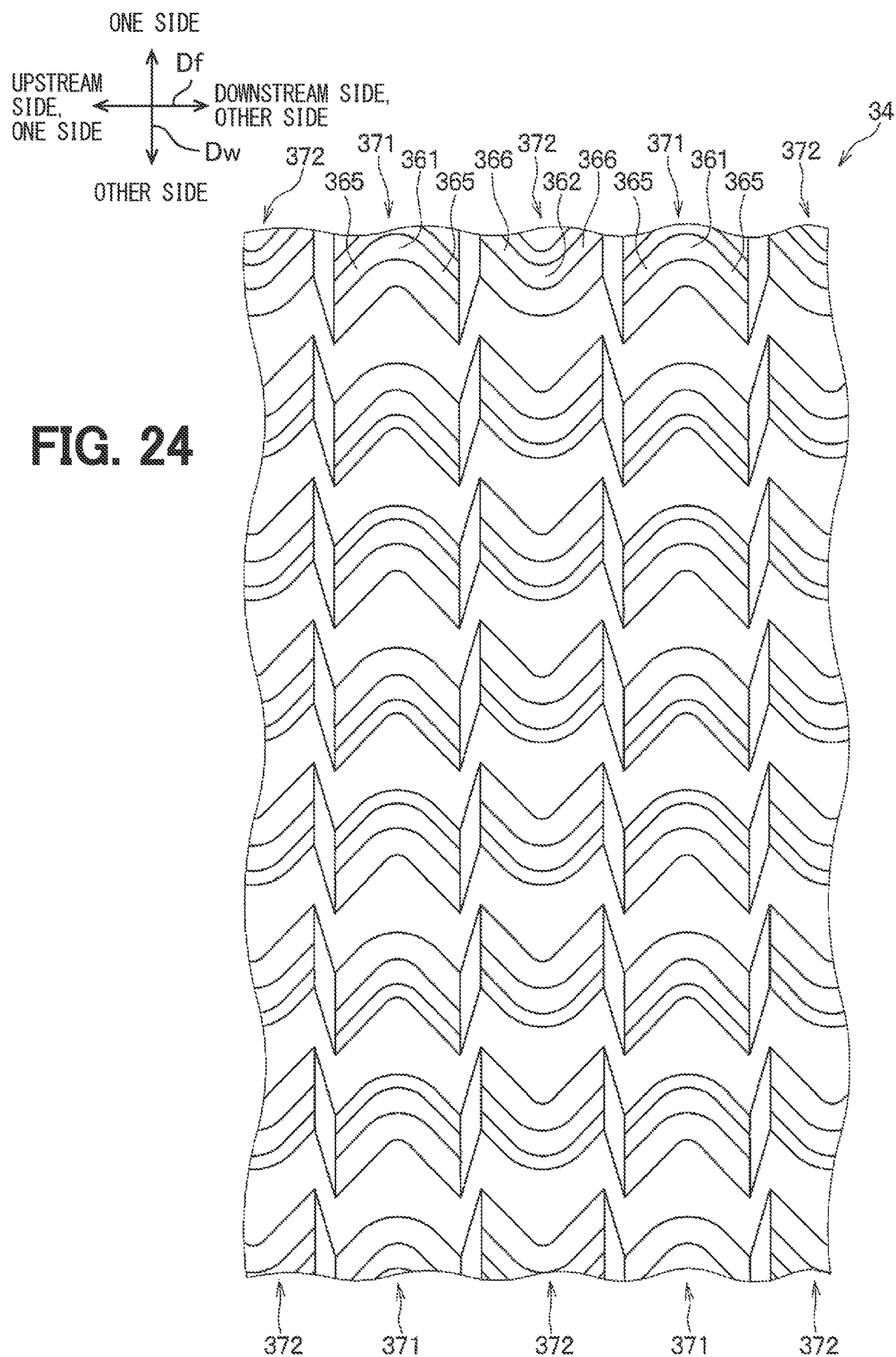
FIG. 24 is a top view illustrating a single first inner fin in a fifth embodiment as viewed in the same direction as in FIG. 5, equivalent to FIG. 11.
Figure 25:
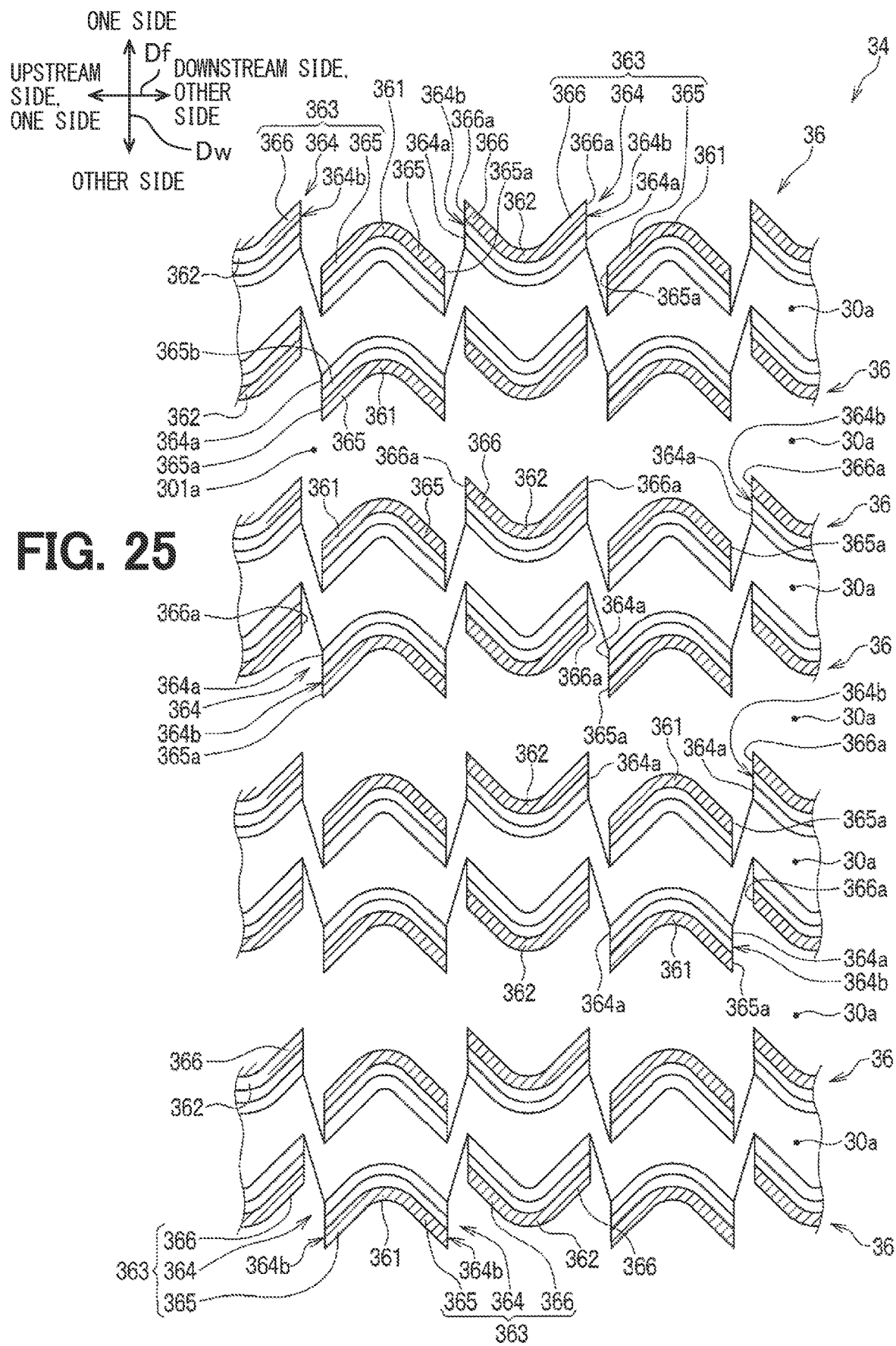
FIG. 25 is a sectional view illustrating a part of a first inner fin in the fifth embodiment as viewed in the second cross section in an excerpted manner, equivalent to FIG. 8.

In the present embodiment, meanwhile, the periphery 364*b* of a communication port 364*a* is formed as shown in FIG. 24 and FIG. 25. That is, the periphery 364*b* of a communication port 364*a* is so formed that a position of an edge 365*a* of a one-side wall part 365 embraced in the periphery 364*b* and an edge 366*a* of the other-side wall part 366 are different from each other in the in-tube flow direction Df.

In detail, in a communication part 364, a one-side wall part 365 and the other-side wall part 366 are away from each other in the in-tube flow direction Df. In other words, the communication part 364 is in such a shape that one of the one-side wall part 365 and the other-side wall part 366 extended to the communication part 364 is retreated from the other in the in-tube flow direction Df.

In the present embodiment, unlike the first embodiment, a first distance C1 and a second distance C2 are equal to each other (refer to FIG. 8).

The present embodiment is identical with the first embodiment except the foregoing. In the present embodiment, an effect brought about by configuration elements common to those of the first embodiment is brought about as in the first embodiment.

The present embodiment is a modification to the first embodiment but the present embodiment can also be combined with any of the second to fourth embodiments.

Sixth Embodiment

A description will be given to the sixth embodiment. In relation to the present embodiment, a description will be given mainly to a difference from the first embodiment.

In the first embodiment, as shown in FIG. 8, the periphery 364*b* of a communication port 364*a* is so formed that a position of an edge 365*a* of a one-side wall part 365 embraced in the periphery 364*b* and a position of an edge 366*a* of the other-side wall part 366 are identical with each other in the in-tube flow direction Df.

Figure 26:
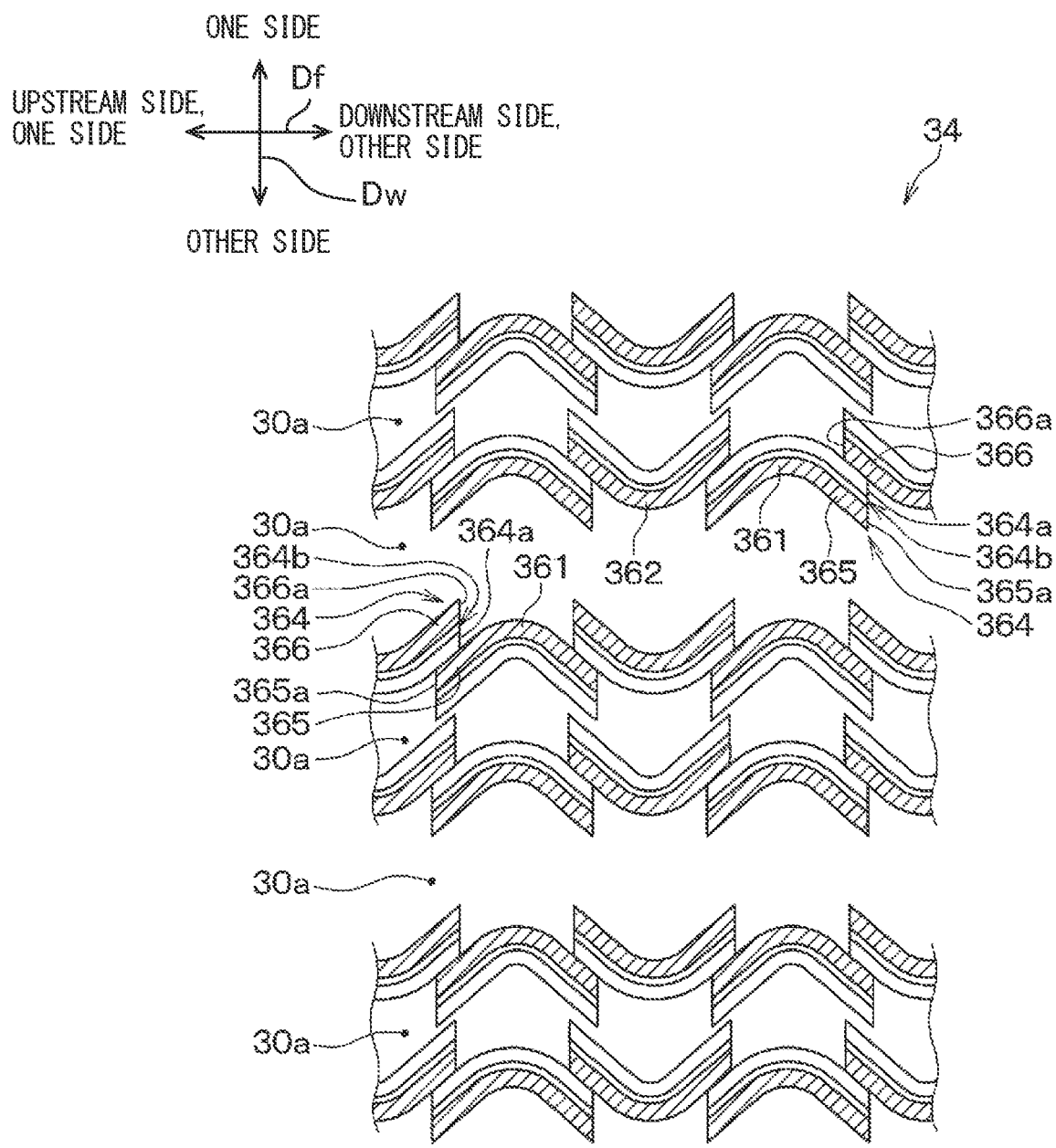
FIG. 26 is a sectional view illustrating a part of a first inner fin in a sixth embodiment as viewed in the second cross section in an excerpted manner, equivalent to FIG. 8.

In the present embodiment, meanwhile, the periphery 364*b* of a communication port 364*a* is formed as shown in FIG. 26. That is, the periphery 364*b* of a communication port 364*a* is so formed that a position of an edge 365*a* of a one-side wall part 365 embraced in the periphery 364*b* and a position of an edge 366*a* of the other-side wall part 366 are different from each other in the in-tube flow direction Df.

In detail, in a communication part 364, a one-side wall part 365 is so provided that the one-side wall part partly overlaps with the other-side wall part 366 on one side or the other side in the flat longitudinal direction Dw. In other words, a communication part 364 is in such a shape that one of a one-side wall part 365 and the other-side wall part 366 extended to the communication part 364 overlaps with the other on one side or the other side in the flat longitudinal direction Dw.

In the present embodiment, unlike the first embodiment, a first distance C1 and a second distance C2 are equal to each other (refer to FIG. 8).

The present embodiment is identical with the first embodiment except the foregoing. In the present embodiment, an effect brought about by configuration elements common to those of the first embodiment is brought about as in the first embodiment.

The present embodiment is a modification to the first embodiment but the present embodiment can also be combined with any of the second to fourth embodiments.

Seventh Embodiment

A description will be given to the seventh embodiment. In relation to the present embodiment, a description will be given mainly to a difference from the first embodiment.

Figure 27:
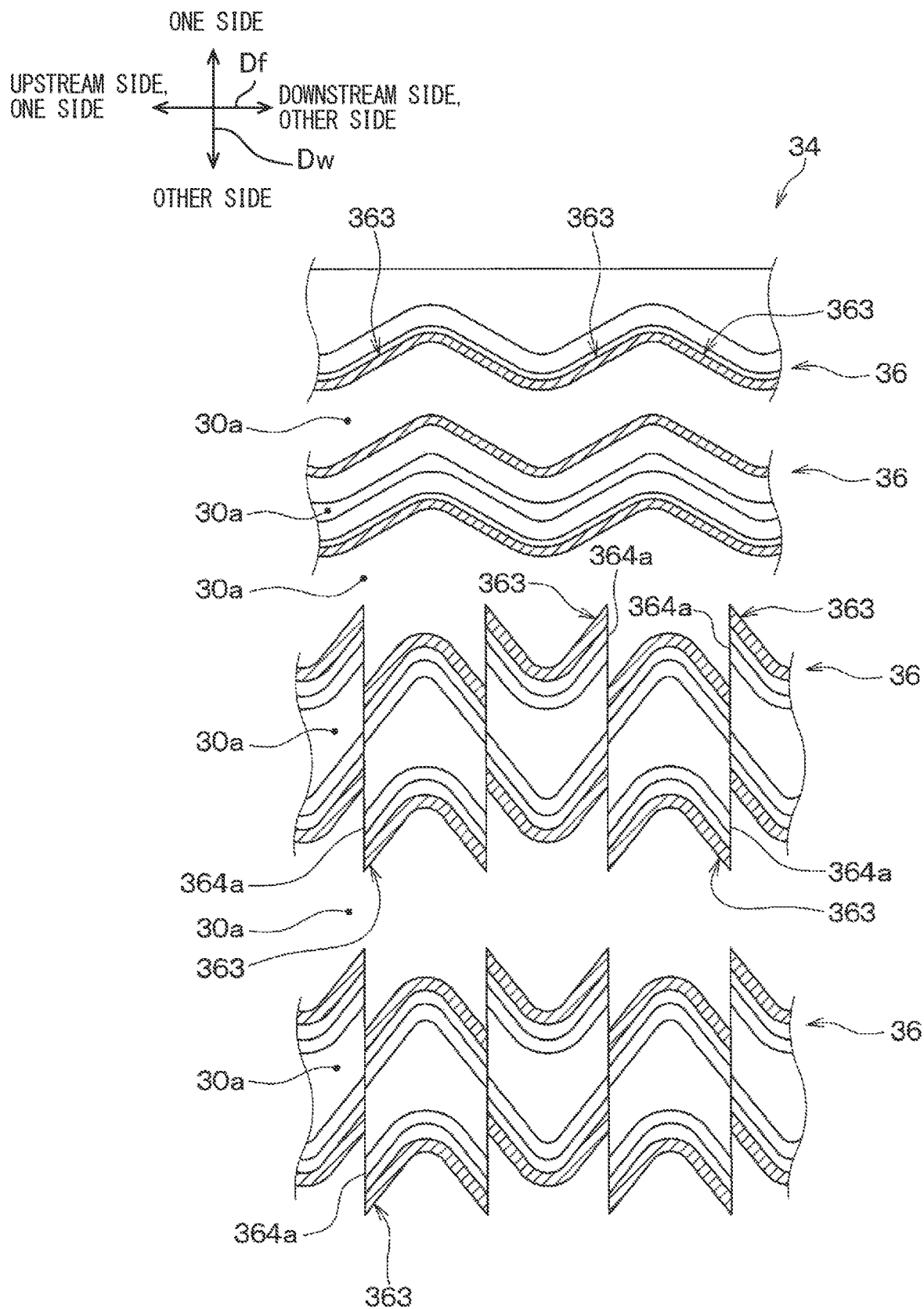
FIG. 27 is a sectional view illustrating a part of a first inner fin in a seventh embodiment as viewed in the second cross section in an excerpted manner, equivalent to FIG. 8.

In the present embodiment, as shown in FIG. 27, the first inner fin 34 includes a plurality of meander shapes 36 arranged in parallel with one another in the flat longitudinal direction Dw as viewed in a second cross section (that is, the cross section in FIG. 27) perpendicular to the flat thickness direction Dt and extended in the in-tube flow direction Df. Each of the meander shapes 36 is formed by a one-side top part 361 and the other-side top part 362 being strung out in the in-tube flow direction Df with an intermediate part 363 in between. The present embodiment is identical with the first embodiment in this regard.

However, in the present embodiment, unlike the first embodiment, a part of the first inner fin 34 is not in such a shape that a first protruded portion 371 (refer to FIG. 11) is offset from a second protruded portion 372 in the flat longitudinal direction Dw. At this spot not in an offset shape, a communication port 364a is not formed.

In detail, a communication port 364a is not formed in all the intermediate parts 363 constituting meander shapes 36 placed at an end on one side in the flat longitudinal direction Dw among a plurality of meander shapes 36 arranged in the flat longitudinal direction Dw. In short, a communication port 364a is not provided in those meander shapes 36 placed on one side.

Though not shown in FIG. 27, a communication port 364a is not formed in all the intermediate parts 363 forming meander shapes 36 placed at an end on the other side in the flat longitudinal direction Dw, either. In short, a communication port 364a is not provided in those meander shapes 36 placed at an end on the other side, either.

According to the present embodiment, owing to this configuration, the heating medium can be prevented from flowing to an end in the flat longitudinal direction Dw in the flow path tube 3 by way of a communication port 364a. If a large quantity of the heating medium to an end in the flat longitudinal direction Dw in the flow path tube 3, the performance of heat exchange between the heating medium and the electronic components 2 is degraded in the flow path tube 3.

In the present embodiment, a first distance C1 and a second distance C2 are equal to each other (refer to FIG. 8).

The present embodiment is identical with the first embodiment except the foregoing. In the present embodiment, an effect brought about by configuration elements common to those of the first embodiment is brought about as in the first embodiment.

The present embodiment is a modification to the first embodiment but the present embodiment can also be combined with any of the second to sixth embodiments.

Eighth Embodiment

A description will be given to the eighth embodiment. In relation to the present embodiment, a description will be given mainly to a difference from the first embodiment.

Figure 28:
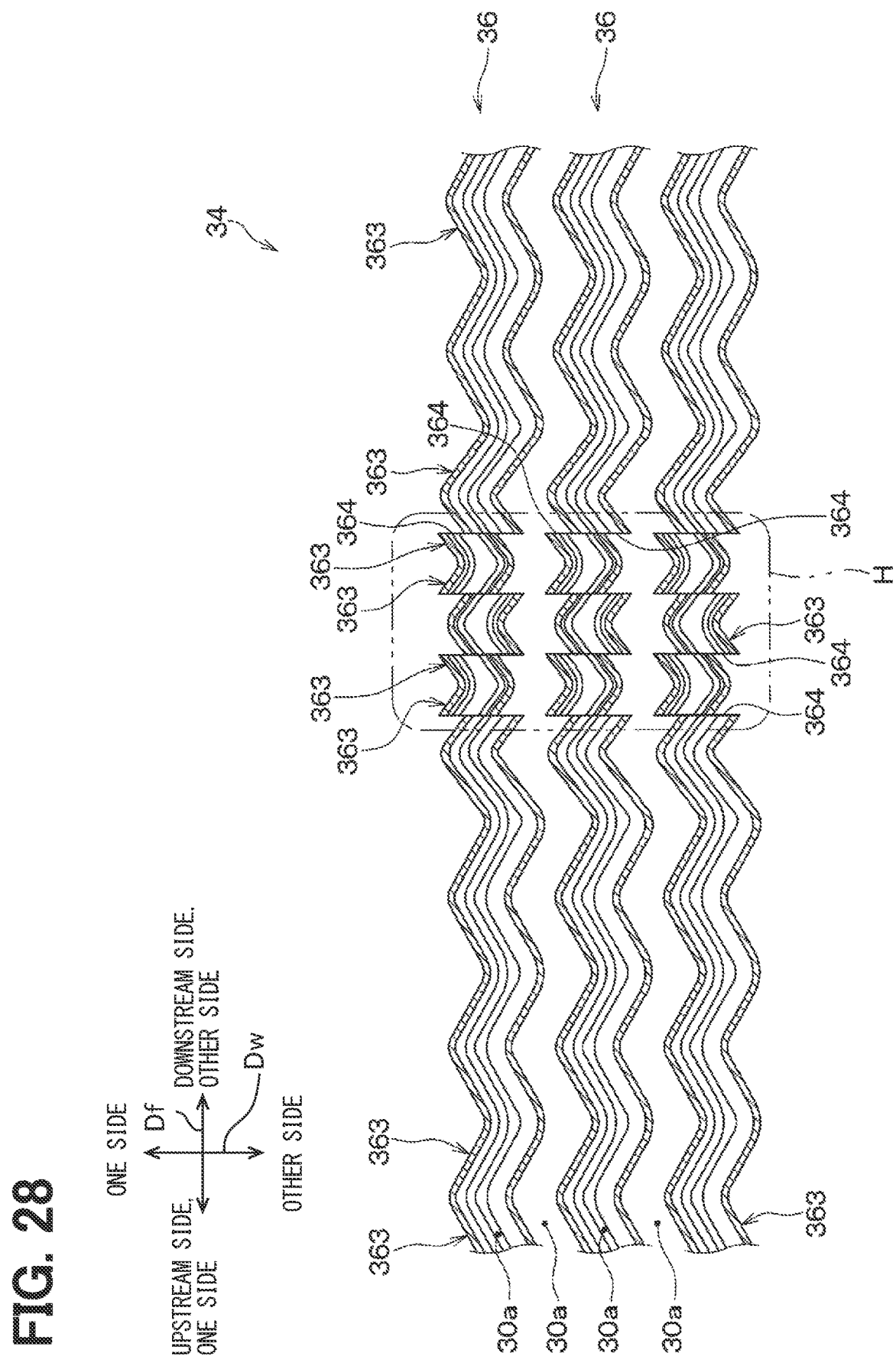
FIG. 28 is a sectional view illustrating a part of a first inner fin in an eighth embodiment as viewed in the second cross section in an excerpted manner, equivalent to FIG. 8.

In the present embodiment, as shown in FIG. 28, a part of the first inner fin 34 is not in such a shape that a first protruded portion 371 (refer to FIG. 11) is offset form a second protruded portion 372 in the flat longitudinal direction Dw. At this spot not in an offset shape, an intermediate part 363 does not include a communication part 364 with a communication port 364a formed therein. The present embodiment is different from the first embodiment in this regard.

Specifically, in the present embodiment, a communication part 364 is provided in the part of H in FIG. 28 as a part of the first inner fin 34 but is not provided in the other parts.

Therefore, a distribution of the communication parts 364 provided in the first inner fin 34 is dense at the central part of the first inner fin 34 as compared with one side and the other side in the in-tube flow direction Df.

According to the present embodiment, owing to this configuration, at the above-mentioned central part of the first inner fin 34 where the high performance of heat exchange between the electronic components 2 and the heating medium is easily obtained in the flow path tube 3, heat exchange between the electronic components 2 and the heating medium can be actively facilitated by the communication parts 364. At the other parts than the central part of the first inner fin 34, meanwhile, a pressure drop created in the heating medium flowing though the fine flow paths 30a can be reduced by eliminating or reducing a number of communication parts 364.

In the present embodiment, a first distance C1 and a second distance C2 are equal to each other (refer to FIG. 8).

The present embodiment is identical with the first embodiment except the foregoing. In the present embodiment, an effect brought about by configuration elements common to those of the first embodiment is brought about as in the first embodiment.

The present embodiment is a modification to the first embodiment but the present embodiment can also be combined with any of the second to seventh embodiments.

Ninth Embodiment

A description will be given to the ninth embodiment. In relation to the present embodiment, a description will be given mainly to a difference from the first embodiment.

Figure 29:
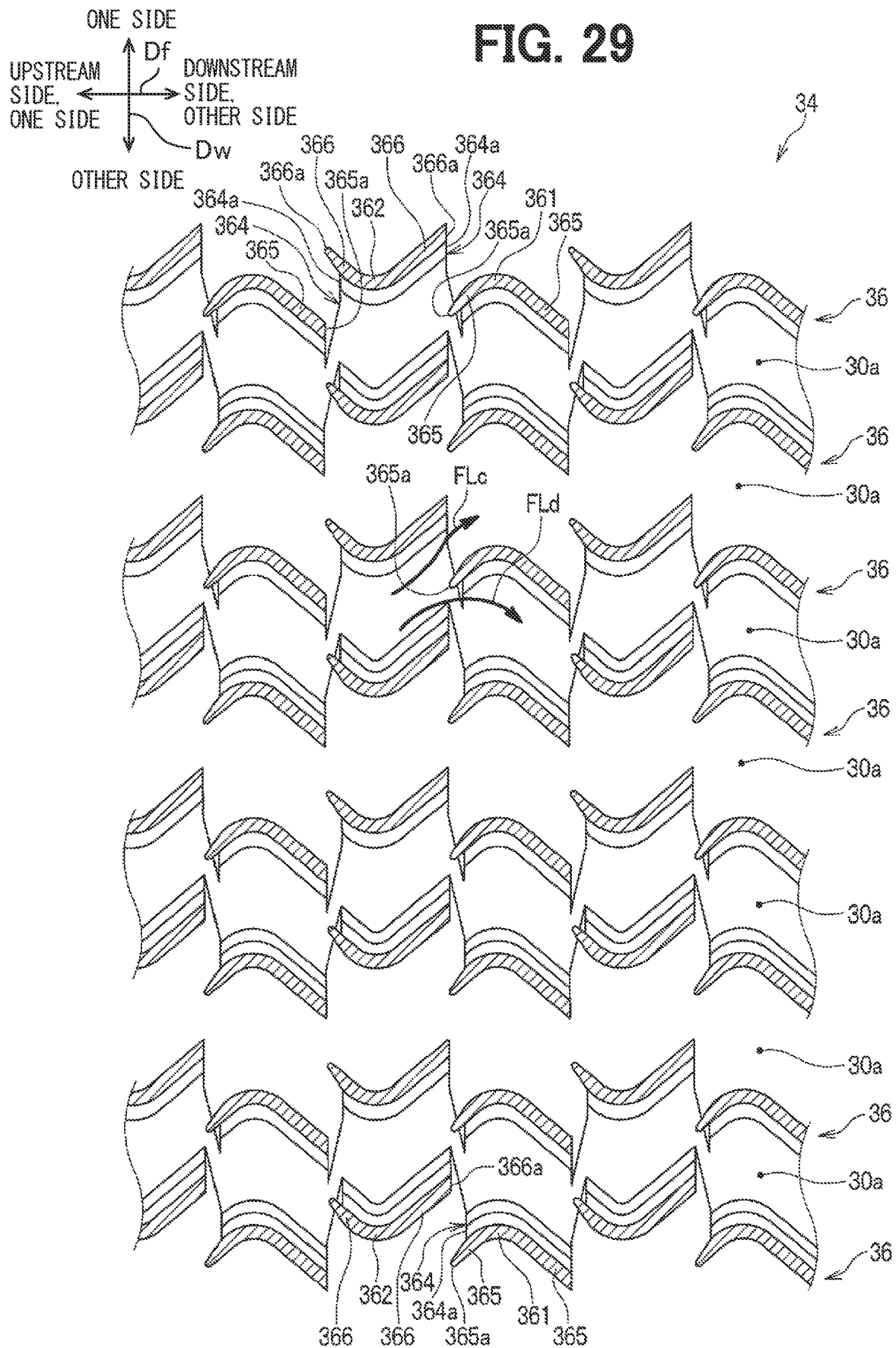
FIG. 29 is a sectional view illustrating a part of a first inner fin in a ninth embodiment as viewed in the second cross section in an excerpted manner, equivalent to FIG. 8.

As shown in FIG. 29, a communication part 364 includes an edge 365a of a one-side wall part 365 and an edge 366a of the other-side wall part 366 which edges constitute the periphery 364b of a communication port 364a. One (that is, one edge) of the two edges 365a, 366a faces to the upstream side of a heating medium flow in a fine flow path 30b and the other faces to the downstream side of the heating medium flow. The present embodiment is identical with the first embodiment in this regard.

However, in the present embodiment, unlike the first embodiment, the one edge constituting the periphery 364b of the communication port 364a, or the opposed edge opposed to a heating medium flow in a fine flow path 30a is in a tapered shape and is more tapered as it goes toward the tip thereof as viewed in the above-mentioned second section. For example, the opposed edge is in a sharp shape as viewed in the above-mentioned second section.

In the present embodiment, owing to this configuration, a heating medium flow is smoothly divided at an opposed edge as indicated by the arrows FLc, FLd. For this reason, a heating medium flow is less prone to separate from a wall surface around the opposed edge and increase in pressure drop due to a separation of a heating medium flow from the wall surface can be suppressed.

The present embodiment is identical with the first embodiment except the foregoing. In the present embodiment, an effect brought about by configuration elements common to those of the first embodiment is brought about as in the first embodiment.

The present embodiment is a modification to the first embodiment but the present embodiment can also be combined with any of the second to eighth embodiments.

Tenth Embodiment

A description will be given to the tenth embodiment. In relation to the present embodiment, a description will be given mainly to a difference from the first embodiment.

In the first embodiment, as shown in FIG. 3, two in-tube flow paths 3a, 3b stacked in the flat thickness direction Dt with an intermediate plate 33 in between are formed in a flow path tube 3. In the present embodiment, meanwhile, as shown in FIG. 30, one in-tube flow path 3a of the two in-tube flow paths 3a, 3b is provided in a flow path tube 3 but the other in-tube flow path 3b is not provided. That is, in-tube flow paths 3a are not stacked in a flow path tube 3 and thus the flow path tube is of a single-layer structure.

Since the in-tube flow path 3a in a flow path tube 3 is of a single-layer structure, the flow path tube 3 includes a first shell plate 31 and a second shell plate 32 but does not include an intermediate plate 33.

Though the second shell plate 32 in the present embodiment is formed of a flat board member, the flow path tube may be in a shape of a recess in which the second shell plate is recessed on the first shell plate 31 side as in the first embodiment.

The present embodiment is identical with the first embodiment except the foregoing. In the present embodiment, an effect brought about by configuration elements common to those of the first embodiment is brought about as in the first embodiment.

The present embodiment is a modification to the first embodiment but the present embodiment can also be combined with any of the second to ninth embodiments.

Other Embodiments (1) As shown in FIG. 1, in each of the above-mentioned embodiments, the heat exchanger 1 is used as a heat extractor cooling a plurality of electronic components 2 as a target of heat exchange. However, usage of the heat exchanger 1 is not limited to for vehicles and varied usage is possible and the target of heat exchange is not limited to electronic components 2. It is also assumed that the heat exchanger 1 is used as a heater heating a target of heat exchange.

(2) In each of the above-mentioned embodiments, the heating medium flowing through the flow path tubes 3 of the heat exchanger 1 is a liquid but this is an example. For example, the heating medium may be a gas or may be a fluid whose phase is changed between vapor phase and liquid phase in the flow path tubes 3.

(3) In each of the above-mentioned embodiments, as shown in FIG. 2, the in-tube flow direction Df corresponds to the longitudinal direction of the flow path tube 3 but this is an example. For example, the flat longitudinal direction Dw may correspond to the longitudinal direction of the flow path tube 3.

(4) In the first embodiment, as shown in FIG. 3, the periphery part of an intermediate plate 33 is sandwiched between a pair of shell plates 31, 32 in the periphery part of a flow path tube 3 but this is an example. An intermediate plate 33 need not reach the periphery part of a flow path tube 3 and the entire intermediate plate 33 may fit within the internal space of the flow path tube 3. A flow path tube 3 need not include an intermediate plate 33 and a first inner fin 34 and a second inner fin 35 may be stacked in contact with each other in a flow path tube 3.

(5) In the second embodiment, as shown in FIG. 17, a one-side elevation angle θb and the other-side elevation angle θc are in a relation of "θc>θb"; however, this relation of "θc>θb" need not hold at all the spots where a sidewall top part 36a is provided.

(6) In the second embodiment, as shown in FIG. 17, each of a pair of extended wall parts 36b, 36c is extended from a sidewall top part 36a to a communication part 364 adjacent to the sidewall top part 36a in the in-tube flow direction Df but this is an example. Of a pair of the extended wall parts 36b, 36c, the other extended wall part 36c could be not extended to a communication part 364. Therefore, the other extended wall part 36c need not be equivalent to either a one-side wall part 365 or the other-side wall part 366 extended to a communication part 364.

(7) In the above description of the first embodiment, the second comparative example shown in FIG. 14 and FIG. 15 is compared with the first embodiment but the second comparative example may be considered to be one of a plurality of embodiments.

(8) In the third and fourth embodiments, as shown in FIG. 20 and FIG. 23, in addition to a through hole 381a formed by the cut and raised part 381, a communication port 364a is also formed in an intermediate part 363 but this is an example. For example, though a through hole 381a is formed in an intermediate part 363, a communication port 364a could not be formed.

With a configuration with a communication port 364a not formed as mentioned above, as viewed in the above-mentioned second cross section shown in FIG. 20 and FIG. 23, an intermediate part 363 is formed in a shape of a wall extended from a one-side top part 361 to the other-side top part 362. Further, the intermediate part 363 separates two fine flow paths 30a adjacent to each other in the flat longitudinal direction Dw with a first inner fin 34 in between among a plurality of fine flow paths 30a from each other.

The cut and raised part 381 provided in the intermediate part 363 is in such a shape that the cut and raised part is cut and raised so as to form a through hole 381a in the intermediate part 363. In detail, the cut and raised part 381 is in such a shape that the cut and raised part is cut and raised so as to from a through hole 381a penetrating the intermediate part 363 on one side or the other side in the in-tube flow direction Df relative to the cut and raised part 381.

With this configuration, a through hole 381a formed by the cut and raised part 381 can be provided, and the heat exchange performance of the heat exchanger 1 can be thereby enhanced.

As in the third and fourth embodiments, the cut and raised part 381 resists compression external force Fa exerted in the flat thickness direction Dt (refer to FIG. 12); therefore, degradation in the strength of the first inner fin 34 due to provision of a through hole 381a in an intermediate part 363 can be suppressed.

(9) In the third and fourth embodiments, as shown in FIG. 20 and FIG. 23, in some cut and raised parts 381 of a plurality of cut and raised parts 381, a through hole 381a is formed on one side in the in-tube flow direction Df relative to the cut and raised parts 381. In other cut and raised parts 381, a through hole 381a is formed on the other side in the in-tube flow direction Df relative to the cut and raised parts 381. However, this is an example.

For example, in all the cut and raised parts 381 provided in a first inner fin 34, a through hole 381a may be formed on one side in the in-tube flow direction Df relative to the cut and raised parts 381. Conversely, in all the cut and raised parts 381 provided in a first inner fin 34, a through hole 381a may be formed on the other side in the in-tube flow direction Df relative to the cut and raised parts 381.

(10) In the first embodiment, as shown in FIG. 8, a first inner fin 34 is provided with a plurality of communication parts 364 with a communication port 364a formed therein but this is an example. For example, only one communication part 364 could be provided in a first inner fin 34.

(11) In the third and fourth embodiments, as shown in FIG. 20 and FIG. 23, a first inner fin 34 is provided with a plurality of through holes 381a and a plurality of cut and raised parts 381 but this is an example. For example, a first inner fin 34 could be provided with only one through hole 381a and only one cut and raised part 381 as well.

(12) The present disclosure is not limited to the above-mentioned embodiments and can be variously modified to implement. The above-mentioned individual embodiments are not irrelevant to one another and can be appropriately combined unless combination is obviously infeasible.

Each element constituting each of the above-mentioned embodiments is not always indispensable unless the element is explicitly specified as indispensable or the element is clearly considered to be indispensable on principles, needless to add. In the above-description of each embodiment, when a numeric value, such as a number of components of the embodiment, a numeric value, a quantity, and a range, is referred to, that specific value is not definitive unless the specific value is explicitly specified as definitive or the specific value is clearly definitive on principles. When in relation to each of the above-mentioned embodiments, a material, a shape, a positional relation, or the like of a component or the like is referred to, the material, shape, positional relation, or the like is not definitive unless explicitly stated otherwise or the specific material, shape, positional relation, or the like is definitive on principles.

What is claimed is:

1. A heat exchanger configured to cause heat exchange between a target of heat exchange and a heating medium, the heat exchanger comprising:
   a flow path tube having a flat cross sectional shape in a first cross section, which is perpendicular to one direction, and configured to cause the heating medium to flow therethrough, wherein an upstream side of a flow of the heating medium is one side in the one direction, wherein a downstream side of the flow of the heating medium is an other side in the one direction; and
   an inner fin
      placed in the flow path tube to divide an internal space of the flow path tube into a plurality of fine flow paths arranged in a longitudinal direction of the flat cross sectional shape,
      having, in the first cross section, a corrugated cross sectional shape in which a one-side protruded form, which is bulged to one side in a thickness direction of the flat cross sectional shape, and an other-side protruded form, which is bulged to an other side in the thickness direction, are alternately arranged and extended in the longitudinal direction, and extended in the one direction, wherein
   in a second cross section perpendicular to the thickness direction, the inner fin has a meander shape in which a one-side top part, which is placed between the fine flow paths and bent to bulge to one side in the longitudinal direction, and an other-side top part, which is placed between the fine flow paths and bent to bulge to an other side in the longitudinal direction, are alternately arranged in the one direction via an intermediate part therebetween,
   the intermediate part includes
      a communication part having a communication port via which two of the fine flow paths, which are adjacent to each other via the inner fin, communicate with each other,
      one-side wall part extended from the one-side top part, which is adjacent to the communication part in the one direction, to the communication part and separating the two of the fine flow paths from each other, and
      an other-side wall part extended from the other-side top part, which is adjacent to the communication part in the one direction, to the communication part and separating the two of the fine flow paths from each other,
   the inner fin includes the communication part that is one or more,
   the communication port is placed in the intermediate part and away from the one-side top part and the other-side top part,
   a periphery of the communication port includes an edge of the one-side wall part and an edge of the other-side wall part, and
   the edge of the one-side wall part is formed such that, in the first cross section, the edge of the other-side wall part is shifted in parallel in the longitudinal direction.

2. The heat exchanger according to claim 1, wherein
the inner fin is an offset fin having an offset shape in which a first protruded portion, which includes the one-side top part and the one-side wall part, is shifted in parallel from a second protruded portion, which includes the other-side top part and the other-side wall part, such that the communication port is increased in width in the longitudinal direction.

3. The heat exchanger according to claim 2, wherein
the offset shape is a shape in which the first protruded portion is shifted in parallel from the second protruded portion to the other side in the longitudinal direction, such that the communication port is increased in width in the longitudinal direction.

4. The heat exchanger according to claim 1, wherein
the inner fin includes a plurality of communication parts including the communication port, and
in each of the communication parts, an edge of the one-side wall part is placed on the other side in the longitudinal direction relative to an edge of the other-side wall part.

5. The heat exchanger according to claim 1, wherein
in the first cross section,
   a cross sectional shape of one of the two of the fine flow paths is a shape of a trapezoid, which is wider on the other side in the thickness direction than on the one side in the thickness direction, and
   a cross sectional shape of the other of the two of the fine flow paths is a shape of a trapezoid, which is wider on the one side in the thickness direction than on the other side in the thickness direction.

6. The heat exchanger according to claim 1, wherein
a sidewall top part is the one-side top part or the other-side top part, which is positioned on the other side of the communication part in the one direction,
a pair of extended wall parts are extended from the sidewall top part and adjacent to each other via the sidewall top part,
the pair of extended wall parts separate the two of the fine flow paths from each other in the second cross section,
one extended wall part of the pair of the extended wall parts is equivalent to the one-side wall part or the other-side wall part and extended from the sidewall top part to the one side in the one direction,
an other extended wall part of the pair of the extended wall parts is extended from the sidewall top part to the other side in the one direction, and an elevation angle of the other extended wall part relative to the one direction is larger than an elevation angle of the one extended wall part relative to the one direction.

7. The heat exchanger according to claim 1, wherein the communication port is formed in each of intermediate parts including the intermediate part and arranged in the one direction, and in the second cross section, the one-side top part or the other-side top part, which is between two of communication ports, which includes the communication port and are adjacent to each other in the one direction, is deviated to the one side in the one direction between the two of the communication ports.

8. The heat exchanger according to claim 1, wherein a plurality of flow path tubes including the flow path tube are stacked in the thickness direction to interpose the target of heat exchange therebetween, and a pair of the flow path tubes are stacked to interpose the target of heat exchange therebetween to press the target of heat exchange in the thickness direction.

9. The heat exchanger according to claim 1, wherein the inner fin includes a first inner fin and a second inner fin, the flow path tube includes an intermediate plate dividing the internal space of the flow path tube in the thickness direction and extended in the one direction, and in the flow path tube, the first inner fin is placed on the one side in the thickness direction relative to the intermediate plate, and the second inner fin is placed on the other side in the thickness direction relative to the intermediate plate.

10. The heat exchanger according to claim 1, wherein the inner fin includes a plurality of communication parts including the communication port, and a distribution of the communication parts is dense at a central part of the inner fin as compared with on the one side and the other side in the one direction.

11. The heat exchanger according to claim 1, wherein the intermediate part includes, as the one-side wall part or the other-side wall part, a cut and raised wall part having a cut and raised part, the cut and raised part is in a shape of cut and raised to form a through hole penetrating the cut and raised wall part on the one side or the other side in the one direction relative to the cut and raised part, and the inner fin includes the through hole, which is one or more, and the cut and raised part, which is one or more.

12. The heat exchanger according to claim 1, wherein in the first cross section, the edge of the one-side wall part and the edge of the other-side wall part are identical with each other in length.

13. The heat exchanger according to claim 1, wherein the flow path tube includes an intermediate plate dividing the internal space of the flow path tube in the thickness direction and extended in the one direction, in the flow path tube, the inner fin is placed on the one side in the thickness direction relative to the intermediate plate, and in the first cross section, an inclination angle of the edge of the one-side wall part relative to the intermediate plate is the same as an inclination angle of the edge of the other-side wall part relative to the intermediate plate.

14. The heat exchanger according to claim 1, wherein in the first cross section, the edge of the one-side wall part and the edge of the other-side wall part do not intersect each other.

15. The heat exchanger according to claim 1, wherein in the first cross section, the edge of the one-side wall part and the edge of the other-side wall part extend from a top portion to a bottom portion and are equally shifted along their entire heights relative to each other.

16. The heat exchanger according to claim 1, wherein in the first cross section, the edge of the one-side wall part and the edge of the other-side wall part are equal distantly spaced apart from each other along their entire lengths.

17. The heat exchanger according to claim 1, wherein in the first cross section, the edge of the one-side wall part and the edge of the other-side wall part being shifted in a width direction such that the edge of the one-side wall part and the edge of the other-side wall part are at equal distance apart from each other along their entire lengths.

* * * * *